(12) United States Patent
Takahashi et al.

(10) Patent No.: US 10,608,062 B2
(45) Date of Patent: Mar. 31, 2020

(54) DISPLAY DEVICE

(71) Applicant: Sharp Kabushiki Kaisha, Sakai, Osaka (JP)

(72) Inventors: Jumpei Takahashi, Sakai (JP); Takeshi Hirase, Sakai (JP); Hisao Ochi, Sakai (JP); Takashi Ochi, Sakai (JP); Tohru Senoo, Sakai (JP); Tohru Sonoda, Sakai (JP); Akihiro Matsui, Sakai (JP); Yoshinobu Miyamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 162 days.

(21) Appl. No.: 16/066,084

(22) PCT Filed: Mar. 16, 2017

(86) PCT No.: PCT/JP2017/010745
§ 371 (c)(1),
(2) Date: Jun. 26, 2018

(87) PCT Pub. No.: WO2018/167926
PCT Pub. Date: Sep. 20, 2018

(65) Prior Publication Data
US 2019/0363146 A1    Nov. 28, 2019

(51) Int. Cl.
*H01L 27/32* (2006.01)
*H01L 51/00* (2006.01)
*H01L 51/52* (2006.01)

(52) U.S. Cl.
CPC ...... *H01L 27/3246* (2013.01); *H01L 27/3262* (2013.01); *H01L 51/0097* (2013.01); *H01L 51/5243* (2013.01); *H01L 2251/5338* (2013.01)

(58) Field of Classification Search
CPC ............ H01L 27/3246; H01L 27/3262; H01L 51/0097; H01L 51/5243
See application file for complete search history.

(56) References Cited

U.S. PATENT DOCUMENTS

| | | | |
|---|---|---|---|
| 7,839,083 B2 * | 11/2010 | Kubota | H01L 27/3258 313/505 |
| 2001/0017516 A1 | 8/2001 | Gonther | |
| 2004/0113550 A1 * | 6/2004 | Adachi | H01L 51/525 313/512 |
| 2005/0077816 A1 * | 4/2005 | Yamada | H01L 51/5228 313/503 |
| 2011/0101317 A1 | 5/2011 | Gregory et al. | |

(Continued)

FOREIGN PATENT DOCUMENTS

| | | |
|---|---|---|
| JP | 2002-518813 A | 6/2002 |
| JP | 2004-095551 A | 3/2004 |

(Continued)

OTHER PUBLICATIONS

Official Communication issued in International Patent Application No. PCT/JP2017/010745, dated May 30, 2017.

*Primary Examiner* — Mark W Tornow
(74) *Attorney, Agent, or Firm* — Keating & Bennett, LLP

(57) ABSTRACT

A bank (BK1*b*) and a bank (BK1*a*) having a height less than a height of the bank (BK1*b*) are intermittently provided on a bank (BK1) covering a peripheral portion of each first electrode (21) of a light emitting element.

20 Claims, 13 Drawing Sheets

(56) References Cited

U.S. PATENT DOCUMENTS

| | | | |
|---|---|---|---|
| 2015/0014636 A1 | 1/2015 | Kang | |
| 2015/0053957 A1 | 2/2015 | Sato et al. | |
| 2015/0060806 A1 | 3/2015 | Park et al. | |
| 2015/0091030 A1 | 4/2015 | Lee et al. | |
| 2015/0279915 A1 | 10/2015 | Morita et al. | |
| 2015/0380685 A1 | 12/2015 | Lee et al. | |
| 2016/0204373 A1 | 7/2016 | Park | |
| 2018/0294428 A1* | 10/2018 | Nishimura | H01L 51/5234 |
| 2019/0058021 A1* | 2/2019 | Kim | G09G 3/3275 |

FOREIGN PATENT DOCUMENTS

| | | |
|---|---|---|
| JP | 2011-526694 A | 10/2011 |
| JP | 2012-199207 A | 10/2012 |
| JP | 2015-041481 A | 3/2015 |
| JP | 2015-195094 A | 11/2015 |

\* cited by examiner

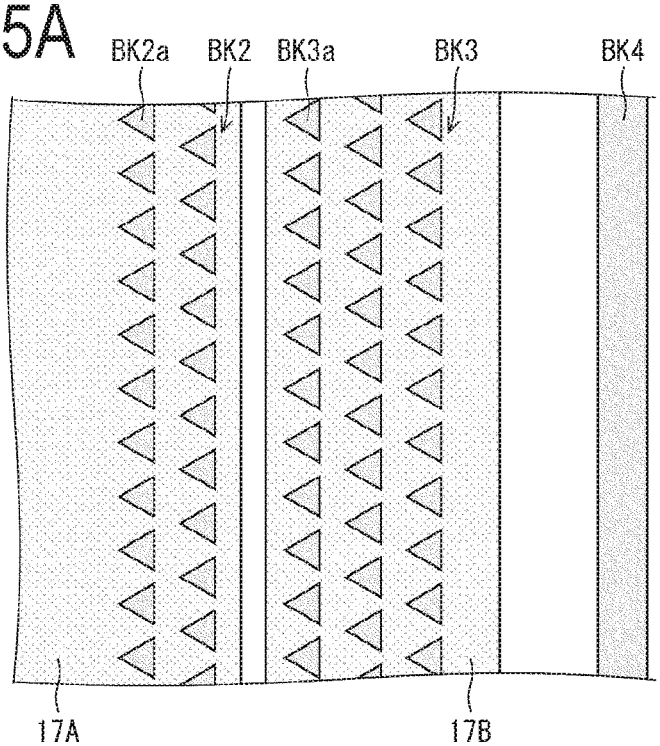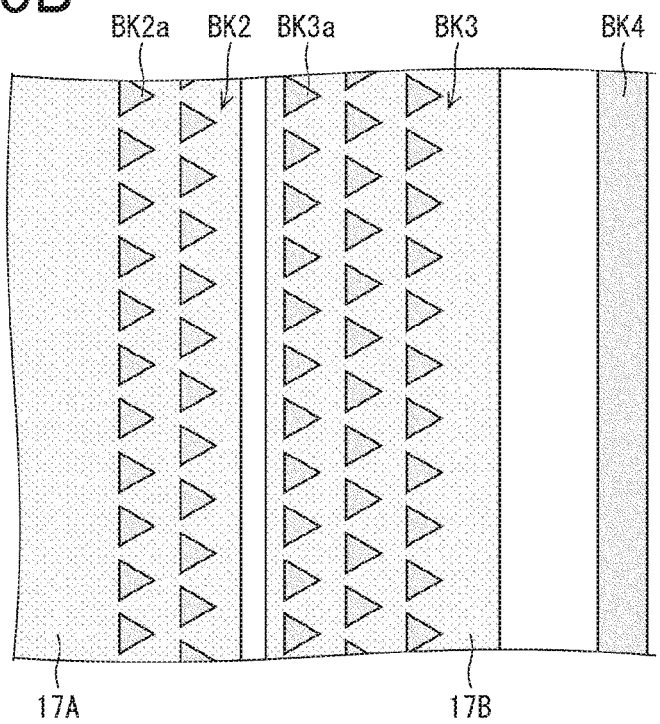

DISPLAY DEVICE

TECHNICAL FIELD

The disclosure relates to a display device and a production method of the display device.

BACKGROUND ART

An Electro Luminescence (EL) display device utilizing EL of a light emitting material has been focused on as a display device having a greater response speed and a greater viewing angle than a liquid crystal display device.

Such a display device includes, for example, a Thin Film Transistor (TFT) substrate including a TFT provided on a support body including a glass substrate or the like, and a light emitting element such as an OLED element provided on the TFT substrate and connected to the TFT.

However, since such a light emitting element is generally susceptible to moisture, oxygen or the like, reaction of the light emitting element with a small amount of moisture or oxygen deteriorates properties of the light emitting element, and impairs a life of a display device.

Accordingly, to prevent moisture or oxygen from entering the light emitting element, there is known, for example, a Thin Film Encapsulation (TFE) technique of sealing a light emitting element with a sealing film formed on the light emitting element and including inorganic layers and organic layers alternately layered one on another (for example, see PTL 1 and PTL 2).

An inorganic layer has a moisture prevention function to prevent entrance of moisture, and functions as a barrier layer. On the other hand, an organic layer is used as a buffer layer (stress release layer) to mainly release stress of the inorganic layer and to level a display region by eliminating a step on a surface of a light emitting element layer including the light emitting element.

For example, Chemical Vapor Deposition (CVD) is used for forming a film of the inorganic layer, and for example, an ink-jet method is used for forming a film of the organic layer (for example, see PTL 2).

CITATION LIST

Patent Literature

PTL 1: JP 2004-95551 A (published Mar. 25, 2004)
PTL 2: JP 2015-41481 A (published Mar. 2, 2015)

SUMMARY

Technical Problem

A sealing film is formed, for example, by forming a film of a first inorganic layer by CVD, applying ink containing a photosensitive resin such as an acrylic resin, an epoxy resin and a silicone resin onto the first inorganic layer by an ink-jet method, curing the ink with an ultraviolet (UV) ray to form an organic layer, and then forming a film of a second inorganic layer on the organic layer by CVD.

When a film of the second inorganic layer is formed to be located as an upper layer of the organic layer, the organic layer has already been cured. Consequently, it is easy to ensure adhesion of the second inorganic layer and the organic layer without cure contraction of the organic layer.

However, owing to cure contraction of the organic layer occurring when the organic layer is cured, adhesion of the first inorganic layer located as a lower layer of the organic layer and the organic layer is low, and film peeling may be generated on a contact interface between the first inorganic layer and the organic layer.

Moreover, to independently control light emission of a light emitting element, a bank (partition) used as a sub pixel separation layer configured to separate respective sub pixels is generally provided between the sub pixels adjacent to each other. The organic layer levels a display region by eliminating a step generated by the bank on a surface of a light emitting element layer.

It can be considered that since the first inorganic layer and the organic layer cover the bank, an increase in a height of the bank increases contact area of the first inorganic layer and the organic layer covering the bank, and it is possible to improve adhesion of the first inorganic layer and the organic layer.

However, when a higher bank is disposed in the display region entirely, the following problem is likely to occur: when an organic layer is formed by an ink-jet method or the like, a material (for example, ink containing the photosensitive resin) of the organic layer stops on the bank, and does not uniformly flow onto respective sub pixels. As a result, the following problem is likely to occur: since the organic layer suffers from a loss or becomes partially thin, the display region cannot entirely be leveled, and a pixel defect is generated. Such a problem becomes more remarkable, particularly when the organic layer has a small film thickness.

The disclosure has been made in light of the above problems, and an object of the disclosure is to provide a display device including a sealing film including an inorganic layer and an organic layer covering a light emitting element, in which adhesion of the organic layer and the inorganic layer located as a lower layer of the organic layer is higher than in the related art and leveling of the display region is easy, and to provide a production method of the display device.

Solution to Problem

To solve the problem, a display device according to an aspect of the disclosure is a display device including a display region provided with a plurality of pixels including a plurality of sub pixels, the display device including: a plurality of light emitting elements each including a first electrode, a functional layer including a light emitting layer and a second electrode layered one on another in this order, with at least the first electrode being provided for each of the sub pixels; a first bank configured to cover a peripheral portion of the first electrode; and a sealing film including a first inorganic layer, an organic layer and a second inorganic layer layered one on another in this order from the second electrode side, and being configured to seal the plurality of light emitting elements, wherein the first bank is intermittently provided with a first high bank part and a first low bank part having a height less than a height of the first high bank part.

To solve the problem, a display device according to an aspect of the disclosure is a display device including a display region provided with a plurality of pixels including a plurality of sub pixels, the display device including: a plurality of light emitting elements each including a first electrode, a functional layer including a light emitting layer and a second electrode layered one on another in this order, with at least the first electrode being provided for each of the sub pixels; a first bank configured to cover a peripheral portion of the first electrode; and a sealing film including a first inorganic layer, an organic layer and a second inorganic layer layered one on another in this order from the second electrode side, and being configured to seal the plurality of light emitting elements; wherein the first bank includes a first step shaped bank part including a plurality of steps, the functional layer and the second electrode are located below a lower step of the first step shaped bank part between the first step shaped bank part and a bank part adjacent to the first step shaped bank part in the first bank, and the first inorganic layer is provided with irregularities derived from the plurality of steps of the first step shaped bank part.

To solve the problem, a production method of a display device according to an aspect of the disclosure is a production method of a display device including a display region provided with a plurality of pixels including a plurality of sub pixels, the display device including a plurality of light emitting elements each including a first electrode, a functional layer including a light emitting layer and a second electrode layered one on another in this order, with at least the first electrode being provided for each of the sub pixels; a first bank configured to cover a peripheral portion of the first electrode; and a sealing film including a first inorganic layer, an organic layer and a second inorganic layer layered one on another in this order from the second electrode side, and being configured to seal the plurality of light emitting elements, the production method including: forming the first bank; forming the functional layer to cover the first electrode including the peripheral portion covered with the first bank; forming the second electrode to cover the functional layer; and forming the sealing film to seal the plurality of light emitting elements; wherein the forming the first bank includes intermittently forming a first high bank part and a first low bank part having a height less than a height of the first high bank part.

To solve the problem, a production method of a display device according to an aspect of the disclosure is a production method of a display device including a display region provided with a plurality of pixels including a plurality of sub pixels, the display device including a plurality of light emitting elements each including a first electrode, a functional layer including a light emitting layer and a second electrode layered one on another in this order, with at least the first electrode being provided for each of the sub pixels; a first bank configured to cover a peripheral portion of the first electrode; and a sealing film including a first inorganic layer, an organic layer and a second inorganic layer layered one on another in this order from the second electrode side, and being configured to seal the plurality of light emitting elements, the production method including: forming the first bank; forming the functional layer to cover the first electrode including the peripheral portion covered with the first bank; forming the second electrode to cover the functional layer; and forming the sealing film to seal the plurality of light emitting elements, wherein the forming the first bank includes forming the first bank including a first step shaped bank part including a plurality of steps, the forming the functional layer includes forming the functional layer to be located below a lower step of the first step shaped bank part between the first step shaped bank part and a bank part adjacent to the first step shaped bank part in the first bank, and the forming the second electrode includes forming the second electrode to be located below the lower step of the first step shaped bank part between the first step shaped bank part and the bank part adjacent to the first step shaped bank part in the first bank.

Advantageous Effects of Disclosure

According to an aspect of the disclosure, it is possible to provide a display device including a sealing film including an inorganic layer and an organic layer covering a light emitting element, in which adhesion of the organic layer and the inorganic layer located as a lower layer of the organic layer is higher than in the related art, and it is possible to provide a production method of the display device.

BRIEF DESCRIPTION OF DRAWINGS

FIGS. 5A and 5B are plan views illustrating apex directions of a first dot shaped bank and a second dot shaped bank each having a planar shape formed in a triangle.

DESCRIPTION OF EMBODIMENTS

Embodiments of the disclosure will be described in detail below.

First Embodiment

An embodiment of the disclosure will be described below with reference to FIGS. 1A and 1B to FIGS. 10A and 10B.

Figure 1A:
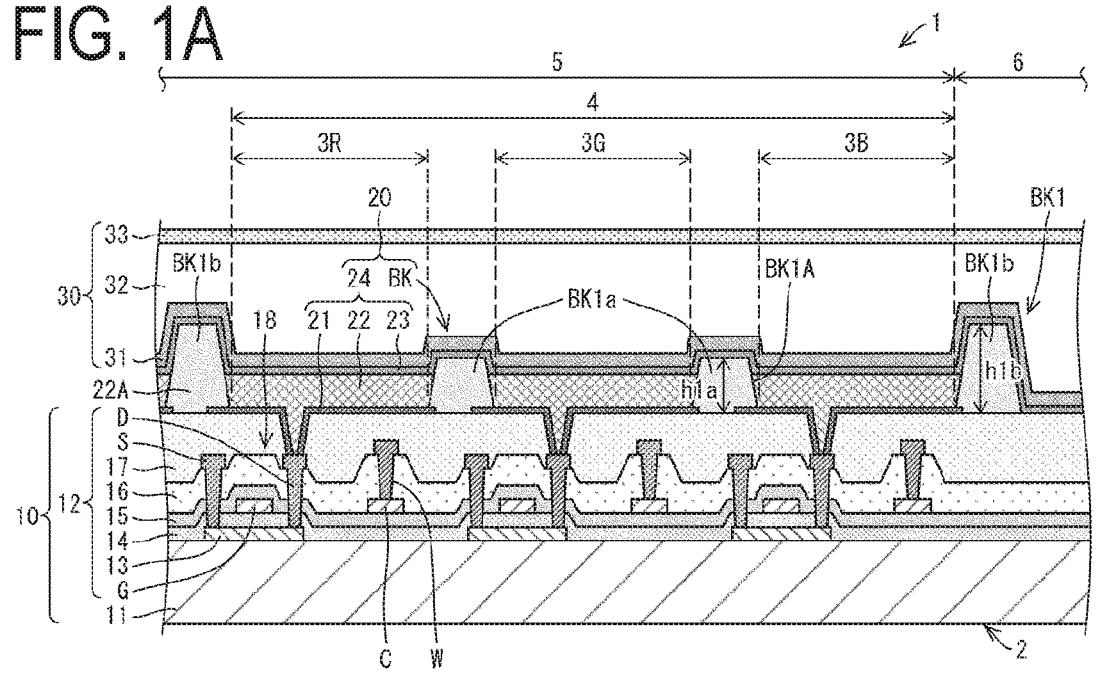
FIG. 1A is a cross-sectional view illustrating an example of a schematic configuration of a display region and a vicinity of the display region of an organic EL display device according to a first embodiment of the disclosure.
Figure 1B:
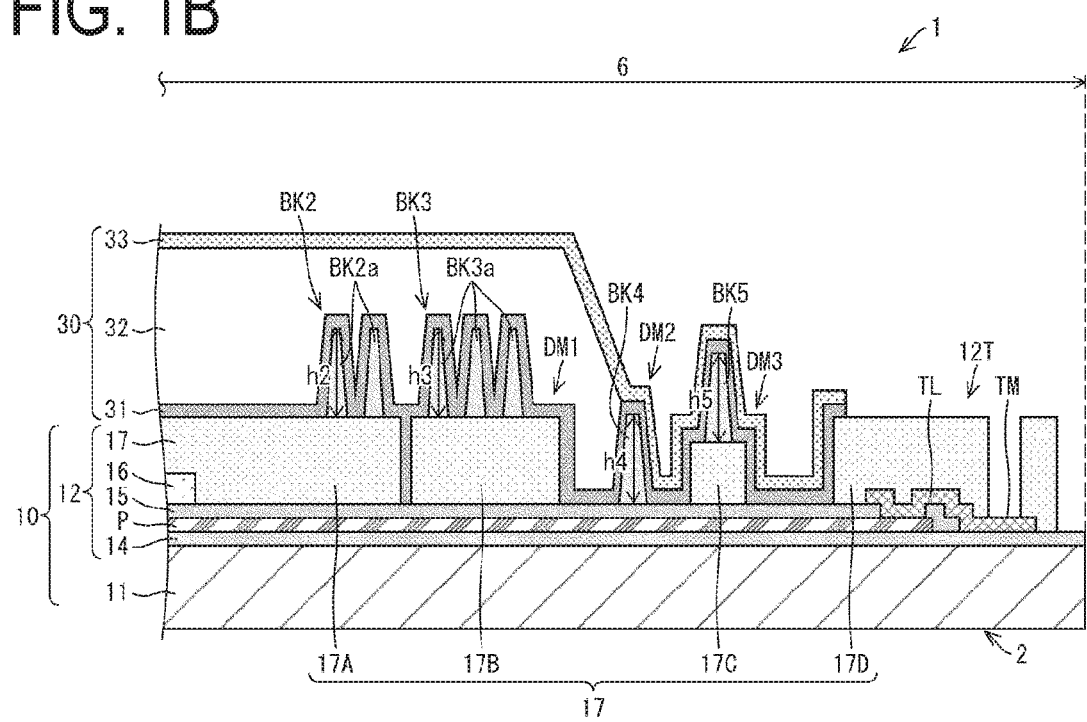
FIG. 1B is a cross-sectional view illustrating an example of a schematic configuration of a frame region of the organic EL display device according to the first embodiment of the present disclosure.
Figure 2:
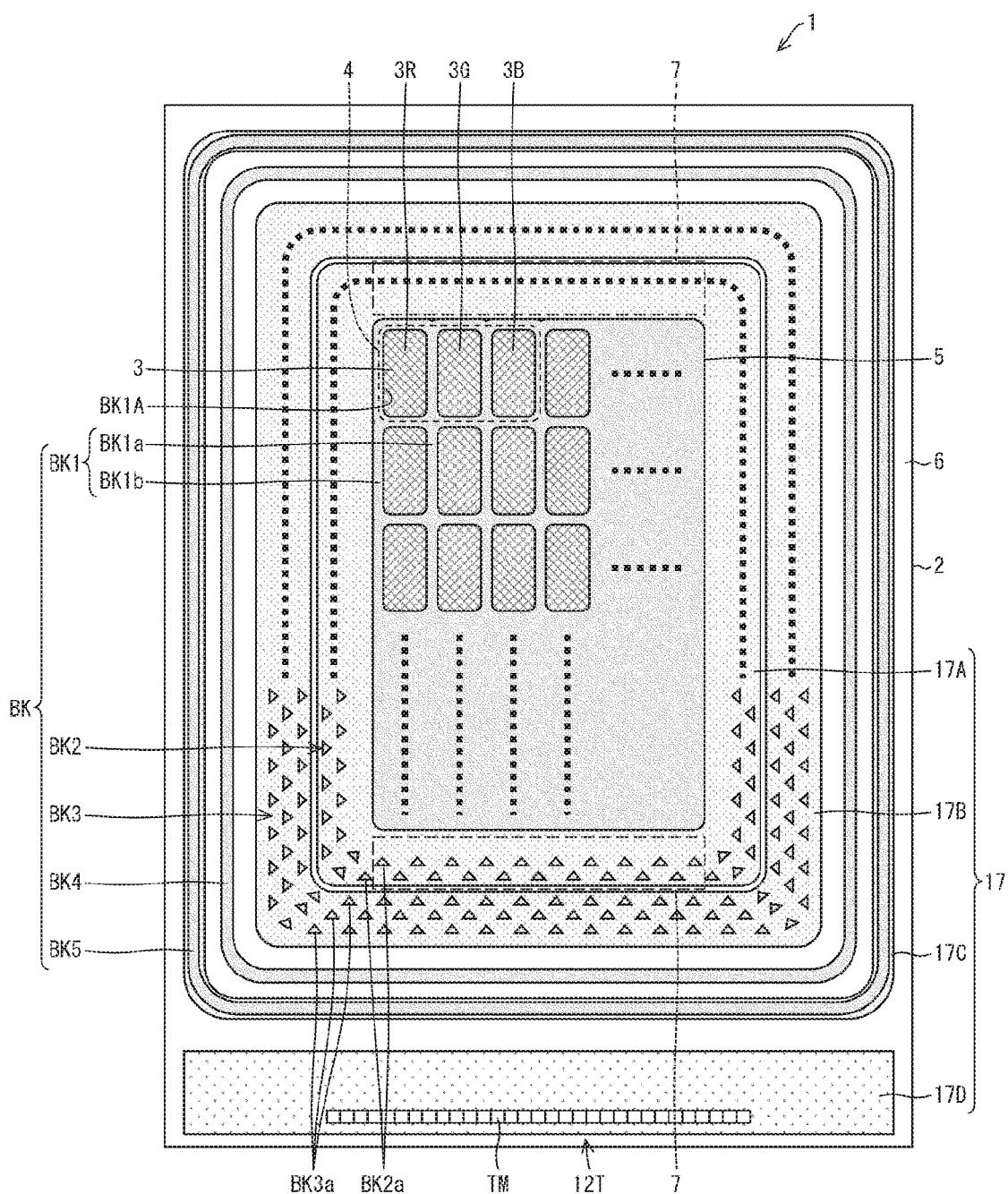
FIG. 2 is a plan view illustrating a schematic configuration of main parts of an organic EL substrate of the organic EL display device illustrated in FIG. 1.
Figure 3:
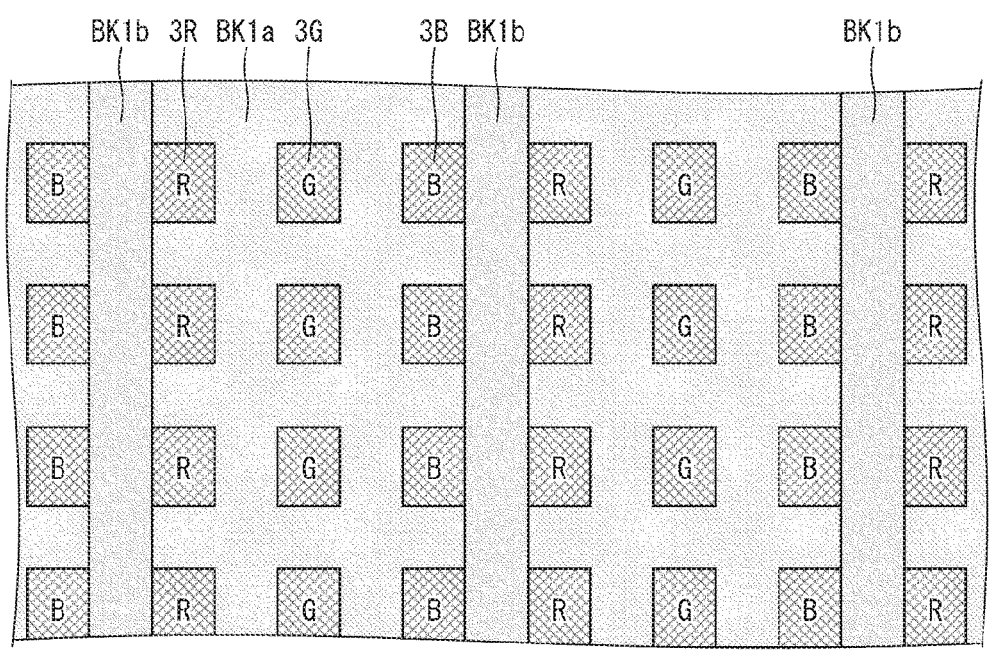
FIG. 3 is a plan view illustrating an example of disposition of a high bank and a low bank in the display region of the organic EL display device according to the first embodiment of the disclosure.

Note that as an example of a display device according to the present embodiment, an organic EL display device including an Organic Light Emitting Diode (OLED) layer including, as a light emitting element, an OLED element referred to as an organic EL element will be described below.
Schematic Configuration of Organic EL Display Device FIG. 1A is a cross-sectional view illustrating an example of a schematic configuration of a display region 5 and a vicinity of the display region 5 of an organic EL display device 1 according to the present embodiment, and FIG. 1B is a cross-sectional view illustrating an example of a schematic configuration of a frame region 6 of the organic EL display device 1 according to the present embodiment. FIG. 2 is a plan view illustrating a schematic configuration of main parts of an organic EL substrate 2 of the organic EL display device 1 illustrated in FIG. 1. FIG. 3 is a plan view illustrating an example of disposition of banks BK1a and BK1b in the display region 5 of the organic EL display device 1 according to the present embodiment. In FIG. 3, for convenience of illustration, steps generated by upper faces (highest portion in each of banks BK1a and BK1b) and end faces (taper faces) of the banks BK1a and BK1b, and steps generated by a difference in heights of the banks BK1a and BK1b are not illustrated.

Note that in FIG. 2, for convenience of illustration, constituents other than banks BK1 to BK5, an organic insulating film 17, and a terminal part 12T provided with a plurality of terminals TM serving as terminals of respective wiring lines in a TFT layer 12 are not illustrated. Moreover, in FIG. 2, for convenience of illustration, a ratio of the frame region 6 to the display region 5 is depicted much larger than in reality.

As illustrated in FIGS. 1A and 1B, the organic EL display device 1 includes the organic EL substrate 2, a drive circuit (not illustrated) and the like.

The organic EL substrate 2 includes an OLED layer 20 including OLED elements (organic EL elements), a sealing film 30 and a cover body (not illustrated) provided on a Thin Film Transistor (TFT) substrate 10 in this order from the TFT substrate 10 side.

Note that the organic EL display device 1 may be a flexible display device having flexibility and foldability, or may be a display device having rigidity and no foldability.
TFT Substrate 10

The TFT substrate 10 includes an insulating support body 11 and the TFT layer 12 provided on the support body 11.
Support Body 11

Examples of the support body 11 include a glass substrate, a plastic substrate and a plastic film. Note that the support body 11 may be a layered film having flexibility and including a barrier layer (moisture prevention layer) provided on a plastic film (resin layer). Moreover, the layered film may further include a lower face film facing the outside and being provided opposite the barrier layer on the plastic film via an adhesive layer.

Examples of a resin used for the plastic film include polyimide, polyethylene and polyamide.

The barrier layer is configured to prevent moisture and impurities from reaching the TFT layer 12 and the OLED layer 20 formed on the support body 11, and the barrier layer can be formed with a film formed by CVD such as a silicon oxide (SiOx) film, a silicon nitride (SiNx) film or a layered film of these films.

The barrier layer is provided entirely on a single face of the plastic film without a surface of the plastic film being exposed. As a result, even when a material sensitive to a chemical solution, for example, polyimide is used as the plastic film, it is possible to prevent elution and step contamination of the plastic film due to the chemical solution.

When the organic EL display device 1 is a flexible display device, the lower face film is applied to a lower face of the plastic film (resin layer) from which a glass substrate is peeled, to produce the organic EL display device 1 excellent in flexibility. For example, a plastic film including a flexible resin having flexibility such as polyethylene terephthalate, polyethylene naphthalate, a cycloolefin polymer, polyimide, polycarbonate, polyethylene and aramid is used for the lower face film.
TFT Layer 12

The TFT layer 12 includes a plurality of semiconductor layers 13 each formed in an island shape, a gate insulating film 14 formed on support body 11 to cover the semiconductor layers 13, a plurality of gate electrodes G formed on the gate insulating film 14, a plurality of gate wiring lines (not illustrated) formed on the gate insulating film 14, a plurality of routing wiring lines P routed from the terminal part 12T of the TFT layer 12 and formed on the gate insulating film 14, an inorganic insulating film 15 (first passivation film) configured to cover the electrodes and wiring lines formed on the gate insulating film 14, a plurality of capacity electrodes C formed on the inorganic insulating film 15, an inorganic insulating film 16 (second passivation film) formed on the inorganic insulating film 15 to cover the capacity electrodes C, a plurality of source electrodes S formed on the inorganic insulating film 16, a plurality of drain electrodes D formed on the inorganic insulating film 16, a plurality of wiring lines W formed on the inorganic insulating film 16, a plurality of source wiring lines (not illustrated) formed on the inorganic insulating film 16, a plurality of power source lines (not illustrated) formed on the inorganic insulating film 16, a plurality of terminal wiring lines TL provided on the terminal part 12T, the organic insulating film 17 (flattering film) configured to cover the electrodes and wiring lines formed on the inorganic insulating film 16 and to cover the terminal wiring TL, and the plurality of terminals TM (terminal electrode) for external connection connected to each of the terminal wiring lines TL.

The semiconductor layers 13 include, for example, amorphous silicon, low-temperature polysilicon (LPTS) or an oxide semiconductor. The gate insulating film 14 includes, for example, silicon oxide (SiOx) or silicon nitride (SiNx) or a layered film thereof.

The gate electrodes G, the source electrodes S, the drain electrodes D, the capacity electrodes C, the wiring line W, the routing wiring line P, the terminal wiring line TL and the terminals TM each include, for example, a monolayer film or layered film of metal such as aluminum (Al), tungsten (W), molybdenum (Mo), tantalum (Ta), chrome (Cr), titanium (Ti) and copper (Cu).

The inorganic insulating films 15 and 16 each include, for example, silicon oxide (SiOx) or silicon nitride (SiNx). The organic insulating film 17 includes, for example, a photosensitive resin material such as a polyimide resin and an acrylic resin.

A TFT 18 is made up of the semiconductor layer 13, the gate electrodes G, the inorganic insulating films 15 and 16, the source electrodes S, and the drain electrodes D.

The source electrodes S and the drain electrodes D are connected to the semiconductor layer 13 via contact holes provided on the gate insulating film 14 and the inorganic insulating films 15 and 16. The source electrodes S are connected to, for example, a power source line (not illustrated). The drain electrodes D are connected to a first electrode 21 via a contact hole passing through the organic insulating film 17. The wiring line W is connected to the capacity electrodes C via a contact hole provided on the inorganic insulating film 16.

Moreover, gate wiring is connected to the gate electrodes G, and source wiring line is connected to the source electrodes S. The gate wiring line and the source wiring line intersect to be orthogonal to each other in a plan view.

A sub pixel 3 is a region surrounded in a lattice shape by the gate wiring line and the source wiring line, and one pixel 4 is formed with a set of respective color sub pixels 3. In the examples illustrated in FIG. 1A and FIG. 2, as the sub pixel 3, a red sub pixel 3R, a green sub pixel 3G and a blue sub pixel 3B are provided, and one pixel 4 is formed with a red sub pixel 3R, a green sub pixel 3G and a blue sub pixel 3B. Each sub pixel 3 is provided with a TFT 18.

Note that FIG. 1A illustrates the example in which the TFT 18 includes a top gate structure using the semiconductor layer 13 as a channel; however, the TFT 18 may include a bottom gate structure.

As illustrated in FIG. 1A and FIG. 2, the organic EL display device 1 includes a display region 5 in which sub pixels 3 are disposed in a matrix shape and an image is displayed, and a frame region 6 that is a peripheral region surrounding a periphery of display region 5 and including no sub pixel 3 disposed.

As illustrated in FIG. 1B, the routing wiring line P, the terminal wiring line TL and the terminals TM are provided in the frame region 6. The terminal wiring line TL is connected to the routing wiring line P via a contact hole provided on the inorganic insulating film 15. In the example illustrated in FIG. 1B, the terminal wiring line TL is electrically connected to, for example, the gate wiring line via the routing wiring line P. The source wiring line is connected to the terminal wiring line TL (not illustrated) via the routing wiring line P (not illustrated).

The organic insulating film 17 levels the display region 5 by eliminating steps on TFT 18 and the wiring line W as illustrated in FIG. 1A, and covers the terminal wiring line TL on the terminal part 12T as illustrated in FIG. 1B.

The terminals TM not covered with the organic insulating film 17 are electrically connected to, for example, an external circuit such as a flexible film cable, a Flexible Printed Circuit (FPC) substrate and an Integrated Circuit (IC), via an Anisotropic Conductive Film (ACF) or the like.

Moreover, the organic insulating film 17 covers an end face of the inorganic insulating film 16 as illustrated in FIG. 1B.

The organic insulating film 17 includes a first organic insulating film pattern part 17A serving as a flattening film and being formed continuously from the display region 5 to the frame region 6, a second organic insulating film pattern part 17B formed in a frame shape in the frame region 6 and separated from the first organic insulating film pattern part 17A to surround the first organic insulating film pattern part 17A, a third organic insulating film pattern part 17C formed in a frame shape and separated from the second organic insulating film pattern part 17B to surround the second organic insulating film pattern part 17B, and a fourth organic insulating film pattern part 17D including an opening to cover the terminal wiring line TL of terminal part 12T and to expose the terminals TM.

The first organic insulating film pattern part 17A is provided with the TFT 18 and an organic EL element 24; however, the second organic insulating film pattern part 17B, the third organic insulating film pattern part 17C and the fourth organic insulating film pattern part 17D are not provided with the TFT 18 or the organic EL element 24.

OLED Layer 20

The OLED layer 20 includes a first electrode 21 (lower electrode) formed on an organic insulating film 17, bank BK (a wall body, a bank), an organic EL layer 22 (functional layer) formed on the first electrode 21 and including an organic layer including at least a light emitting layer, and a second electrode 23 (upper electrode) formed on the organic EL layer 22.

The first electrode 21, the organic EL layer 22, and the second electrode 23 constitute the organic EL element 24 (OLED element). Note that in the present embodiment, the layers between the first electrode 21 and the second electrode 23 are collectively referred to as the organic EL layer 22.

Moreover, an optical adjustment layer (not illustrated) configured to carry out optical adjustment, and a protection layer configured to protect the second electrode 23 and to prevent oxygen and moisture from entering the organic EL element 24 from the outside may be formed on the second electrode 23. In the present embodiment, the organic EL layer 22 formed on each of the sub pixels 3, a pair of electrode layers (first electrode 21 and second electrode 23) sandwiching the organic EL layer 22, and an optical adjustment layer and protection layer (not illustrated) formed as a necessary are collectively referred to as the organic EL element 24.

The first electrode 21 is formed on the organic insulating film 17 used as a flattening film and located in the display region 5. The first electrode 21 injects (supplies) holes into the organic EL layer 22, and the second electrode 23 injects electrons into the organic EL layer 22. Excitons are formed by recombining in the organic EL layer 22 the holes and electrons injected into the organic EL layer 22. When the excitons formed are inactivated from an excited state to a ground state, the excitons emit light and the light emitted is emitted outside the organic EL element 24.

The first electrode 21 is electrically connected to the TFT 18 via a contact hole formed in the organic insulating film 17.

The first electrode 21 is a pattern electrode patterned and formed in an island shape for each sub pixel 3. On the other hand, the second electrode 23 is a solid common electrode commonly provided on each sub pixel 3.

As illustrated in FIG. 2, a second electrode connection part 7 provided with a second electrode connection electrode (not illustrated) connected to the second electrode 23 is provided outside the display region 5, specifically, outside each of a pair of sides of two pairs of sides of the display region 5, along each of the opposing sides.

Bank BK includes a bank BK1 (a first bank, a bank formed in a lattice shape) disposed in the display region 5, and banks BK2 to BK5 (frame shaped banks) disposed in the frame region 6.

The peripheral portion of the first electrode 21 is covered with the bank BK1. The bank BK1 functions as an edge cover configured to prevent electrode concentration and a short circuit with the second electrode 23 due to thinning of the organic EL layer 22 from occurring at the peripheral portion of first electrode 21, and also functions as a sub pixel separation layer configured to separate the sub pixels 3 to prevent current from leaking into the sub pixels 3 adjacent to each other.

As illustrated in FIG. 1A and FIG. 2, the bank BK1 is provided with an opening BK1A for each sub pixel 3. An exposed part of the first electrode 21 generated by the opening BK1A is a light emitting region of each sub pixel 3.

As illustrated in FIG. 1A, in the case of carrying out coloring such that the organic EL layer 22 of the organic EL element 24 outputs different colored light for each sub pixel 3, an organic EL layer 22 is formed for each region surrounded by the bank BK1 (sub pixel 3). Consequently, the organic EL display device 1 illustrated in FIG. 1A outputs red light from the red sub pixel 3R, outputs green light from the green sub pixel 3G, and outputs blue light from the blue sub pixel 3B. Thus, when the organic EL display device 1 includes the organic EL element 24 of an RGB coloring system, it is possible to display a full color image with red light, green light and blue light and without using a color filter.

The organic EL layer 22 includes, for example, a hole injecting layer, a hole transport layer, a light emitting layer, an electron transport layer and an electron injecting layer layered one on another in this order from the first electrode 21 side. Note that one layer may have a plurality of functions. For example, in place of the hole injecting layer and the hole transport layer, a layer serving as both the hole injecting layer and the hole transport layer and having the functions of these two layers may be provided. Moreover, in place of the electron injecting layer and the electron transport layer, a layer serving as both the electron injecting layer and the electron transport layer and having the functions of these two layers may be provided. Moreover, a carrier blocking layer may be provided appropriately between respective layers.

Note that the layering order is an example in a case where the first electrode 21 is used as a positive electrode and the second electrode 23 is used as a negative electrode, and in a case where the first electrode 21 is used as a negative electrode and the second electrode 23 is used as a positive electrode, the order of respective layers constituting the organic EL layer 22 is reversed.

When the organic EL display device 1 is of a bottom-emitting type configured to emit light from the rear face side of the support body 11, the second electrode 23 is preferably formed with a reflective electrode material, and the first electrode 21 is preferably formed with a transparent electrode material that is clear or opaque.

For example, a transparent conductive film such as Indium Tin Oxide (ITO) and Indium Zinc Oxide (IZO), or a metal thin film such as Au (gold), Pt (platinum) and Ni (nickel) is used for the first electrode 21. A metal having a small work function such as Li (lithium), Ce (cerium), Ba (barium) and Al (aluminum), or an alloy containing these metals such as a magnesium alloy (MgAg or the like), an aluminum alloy (AlLi, AlCa, AlMg or the like) is used for the second electrode 23 to inject electrons into a light emitting layer.

On the other hand, when the organic EL display device 1 is of a top-emitting type configured to emit light from the sealing film 30 side, the first electrode 21 is preferably formed with a reflective electrode material, and the second electrode 23 is preferably formed with a transparent electrode material that is clear or opaque.

The first electrode 21 and the second electrode 23 may each include a single layer, or may each include a layered structure. For example, when the organic EL element 24 is an organic EL element of a top-emitting type, the first electrode 21 may include a layered structure including a reflective electrode and a transparent electrode.

Sealing Film 30

The sealing film 30 includes a first inorganic layer 31 (lower layer inorganic sealing layer), an organic layer 32 (first organic sealing layer) and a second inorganic layer 33 (upper layer inorganic sealing layer) layered one on another in this order from the TFT substrate 10 side.

The first inorganic layer 31 and the second inorganic layer 33 have a moisture prevention function to prevent entrance of moisture, and functions as a barrier layer to prevent deterioration of the organic EL element 24 due to moisture and oxygen.

The organic layer 32 is used as a buffer layer (stress release layer), and carries out stress release of the first inorganic layer 31 and the second inorganic layer 33 having large film stress, or leveling of the display region 5 or filling of a pin hole by eliminating a step or foreign objects on a surface of the OLED layer 20, or suppresses generation of cracks or film peeling at the time of layering the second inorganic layer 33.

The first inorganic layer 31 and the second inorganic layer 33 can each include, for example, a film formed by CVD such as a silicon oxide film, a silicon nitride film or a silicon oxide nitride film, or a layered film of these films.

The organic layer 32 is a transparent organic insulating film thicker than the first inorganic layer 31 and the second inorganic layer 33, and can include a photosensitive resin such as an acrylic resin and an epoxy resin. The organic layer 32 can be formed by, for example, applying, as an organic insulating material, ink containing such a photosensitive resin onto the first inorganic layer 31 by an ink-jet method, and then curing the ink with UV light.

The first inorganic layer 31 is formed on the support body 11 to cover the organic insulating film 17 (specifically, from the first organic insulating film pattern part 17A to the third organic insulating film pattern part 17C, and an edge on the third organic insulating film pattern part 17C side in the fourth organic insulating film pattern part 17D) except for part of the terminal part 12T, and to cover the organic EL element 24 and banks BK1 to BK5.

The organic layer 32 desirably covers the first organic insulating film pattern part 17A, the second organic insulating film pattern part 17B, the organic EL element 24 and the banks BK1 to BK3 via the first inorganic layer 31, and also covers an edge and an upper part on the bank BK3 side in the bank BK4 functioning as an organic layer stopper. However, the organic layer 32 may cover at least part of the second organic insulating film pattern part 17B, and may cover an edge and an upper part on the bank BK4 side in the bank BK5 via the first inorganic layer 31.

The second inorganic layer 33 covers the first inorganic layer 31 to seal the organic layer 32 between the second inorganic layer 33 and the first inorganic layer 31. The second inorganic layer 33 covers the organic insulating film 17 except for the part of the terminal part 12T described above, the organic EL element 24 and the banks BK1 to BK5 via at least the first inorganic layer 31 of the first inorganic layer 31 and the organic layer 32.

Note that as described above, an inorganic layer or an organic layer such as an optical adjustment layer and an electrode protection layer (not illustrated) may be formed between the second electrode 23 and the sealing film 30.

Banks BK1 to BK5

Among the banks BK1 to BK5, the bank BK1 is formed on the organic insulating film 17 in the display region 5. Moreover, the banks BK2, BK3 and BK5 are formed on the organic insulating film 17 in the frame region 6. The bank BK4 is formed on the inorganic insulating film 15 in the frame region 6.

More specifically, the bank BK1 is provided, for example, in a lattice shape in a planer view to cover each edge of the first electrode 21 disposed in a matrix shape in the first organic insulating film pattern part 17A in the display region 5. The bank BK2 (second bank, first frame shaped bank) is formed in a frame shape in the first organic insulating film pattern part 17A in the frame region 6 to surround the display region 5.

In other words, the first organic insulating film pattern part 17A is provided with the bank BK1 formed in a lattice shape, and is provided with the bank BK2 formed in a frame shape outside of the bank BK1 formed in a lattice shape to surround the bank BK1 formed in a lattice shape.

In the examples illustrated in FIG. 1B and FIG. 2, the bank BK2 includes a plurality of dot shaped banks BK2a (first dot shaped banks) separated from one another, and a plurality of columns of the dot shaped banks BK2a is each disposed in an intermittent frame shape and is also regularly disposed in a zig zag pattern such that the dot shaped banks BK2a in the lines adjacent to each other are alternately disposed.

The dot shaped banks BK2a are formed such that density of dot shaped banks BK2a per area corresponding to one pixel in a mounting region of the bank BK2 (a proportion of the area occupied by dot shaped banks BK2a in the area corresponding to one pixel in a mounting region of the bank BK2) is higher than density of banks BK1 per pixel (a proportion of the area occupied by banks BK1 in one pixel). Moreover, the dot shaped banks BK2a are formed such that density of dot shaped banks BK2a per area corresponding to one pixel in a mounting region of the bank BK2 is higher than density of banks BK1b per pixel (a proportion of the area occupied by banks BK1b in one pixel). A pitch between dot shaped banks BK2a adjacent to each other is less than a pitch between banks BK1b adjacent to each other.

Note that FIG. 1B and FIG. 2 each illustrate the example in which the bank BK2 is a double frame shaped bank including two columns of dot shaped banks BK2a each disposed in an intermittent frame shape. However, the bank BK2 may be formed in a multiple frame shape including a double or more frame shape. For example, the bank BK2 may be a triple frame shaped bank including three columns of dot shaped banks BK2a, or may include four or more columns of dot shaped banks BK2a.

The bank BK3 (third bank, second frame shaped bank) is provided in and along the second organic insulating film pattern part 17B formed in a frame shape and provided in the frame region 6, and the bank BK3 is formed in a frame shape outside of the bank BK2 formed in a frame shape to surround the bank BK2.

In the example illustrated in each of FIG. 1B and FIG. 2, the bank BK3 includes a plurality of dot shaped banks BK3a (second dot shaped banks) separated from one another, and a plurality of columns of dot shaped banks BK3a is each disposed in an intermittent frame shape and is also regularly disposed in a zig zag pattern such that the dot shaped banks BK3a in the lines adjacent to each other are alternately disposed.

The dot shaped banks BK3a are formed such that density of dot shaped banks BK3a per area corresponding to one pixel in a mounting region of banks BK3 is higher than density of banks BK1b per pixel. A pitch between dot shaped banks BK3a is less than a pitch between banks BK1b adjacent to each other.

Note that FIG. 1B and FIG. 2 each illustrate an example in which the bank BK3 is a triple frame shaped bank including three columns of dot shaped banks BK3a each disposed in an intermittent frame shape; however, the bank BK3 may be a double frame shaped bank including two columns of dot shaped banks BK3a, or may include four or more columns of dot shaped banks BK3a.

The bank BK4 (fourth bank, third frame shaped bank) serves as an organic layer stopper (first organic layer stopper) configured to stop the organic layer 32, and the bank BK4 is formed in a frame shape including a continuous line having a constant width between the second organic insulating film pattern part 17B and the third organic insulating film pattern part 17C, each of which is provided in a frame shape in the frame region 6.

In other words, the bank BK4 is formed in a frame shape including a continuous line, rather than in a dot shape, outside of the second organic insulating film pattern part 17B to surround the second organic insulating film pattern part 17B.

The bank BK5 (fifth bank, fourth frame shaped bank) serves as a preliminary organic layer stopper (second organic layer stopper) configured to stop the organic layer 32. The bank BK5 is provided in and along the third organic insulating film pattern part 17C formed in a frame shape and provided in the frame region 6, and the bank BK5 is formed in a frame shape including a continuous line having a constant width, outside of the bank BK4 formed in a frame shape to surround the bank BK4.

A cross section of each bank BK is preferably formed in a forward tapered shape to improve coverage of a formation face on which each bank BK is formed.

In the present embodiment, as illustrated in FIG. 2, the display region 5 is formed in a rectangular shape. Consequently, the first organic insulating film pattern part 17A is formed in a rectangular shape having an outer shape corresponding to a rectangular shape of the display region 5 and being roughly geometrically similar to the outer shape of the display region 5. Moreover, the second organic insulating film pattern part 17B and the third organic insulating film pattern part 17C surrounding the first organic insulating film pattern part 17A, and the bank BK4 formed between the second organic insulating film pattern part 17B and the third organic insulating film pattern part 17C are also formed in a rectangular shape having an outer shape (outer edge shape of a frame) roughly geometrically similar to the outer shape of the display region 5.

Note that four angular parts of the first organic insulating film pattern part 17A, the second organic insulating film pattern part 17B, the third organic insulating film pattern part 17C and the bank BK4 may include curved lines as illustrated in FIG. 2, or may include right angles as illustrated in FIG. 3.

The first organic insulating film pattern part 17A is preferably formed such that a linear distance from each edge of the display region 5 to each inner side face of the first organic insulating film pattern part 17A opposing each edge is constant. Moreover, the second organic insulating film pattern part 17B is preferably formed such that a linear distance from each outer side face of the first organic insulating film pattern part 17A to each inner side face of the second organic insulating film pattern part 17B opposing each outer side face is constant. The bank BK4 is preferably formed such that a linear distance from each outer side face of the second organic insulating film pattern part 17B to each inner side face of bank BK4 opposing each outer side face is constant. The third organic insulating film pattern part 17C is preferably formed such that a linear distance from each outer side face of the bank BK4 to each inner side face of the third organic insulating film pattern part 17C opposing each outer side face is constant.

As described above, the bank BK2 formed in a frame shape, the bank BK3 formed in a frame shape, the bank BK4 formed in a frame shape and the bank BK5 formed in a frame shape are provided outside of the bank BK1 formed in a lattice shape, in this order from the inside to the outside with the bank BK1 formed in a lattice shape as the center.

The banks BK1 to BK5 include organic insulating materials. The banks BK1 to BK5 are formed with, for example, a photosensitive resin such as an acrylic resin and a polyimide resin. The banks BK1 to BK5 can be formed in, for example, the same step.

As illustrated in FIGS. 1A and 1B, and FIG. 2, the bank BK1 includes a plurality of banks differing in height. According to the examples illustrated in FIGS. 1A and 1B and FIG. 2, the bank BK1 includes a bank BK1$a$ (first edge cover), and a bank BK1$b$ (second edge cover) having height h1$b$ (see FIG. 1A) greater than height h1$a$ (see FIG. 1A) of bank BK1$a$.

Note that the bank BK1$b$ may be formed with a plurality of resin layers, or may be formed with a single resin layer.

The bank BK1$b$ is intermittently provided. For example, as illustrated in FIG. 3, the bank BK1$b$ is formed in a linear shape along a column direction (second direction) at the boundary between the pixels 4 in a row direction (first direction) to divide respective pixels 4 in the row direction.

Note that here, the column direction refers to an arrangement direction of the sub pixels 3R, 3G and 3B of respective colors, and the row direction refers to a row direction orthogonal to the column direction.

In FIG. 3, as described above, the bank BK1$b$ is provided in a linear shape along the column direction; however, the bank BK1$b$ may be provided in a linear shape along the row direction at the boundary between the pixels 4 in the column direction to divide respective pixels 4 in the column direction.

Moreover, the bank BK1$b$ may be provided to divide the plurality of respective pixels 4 in the row direction or in the column direction. Therefore, the bank BK1$b$ may be provided in a linear shape along the column direction with at least one pixel 4 sandwiched in the row direction, or may be provided in a linear shape along the row direction with at least one pixel 4 sandwiched in the column direction.

Note that FIG. 2 and FIG. 3 each illustrate the example in which the organic EL display device 1 includes a sub pixel arrangement of a vertical stripe type (vertical stripe arrangement) where the sub pixels 3R, 3G and 3B are each provided in a linear shape in the column direction. However, the present embodiment is not limited to this example. For example, the organic EL display device 1 may include a sub pixel arrangement of a so-called pentile type (pentile arrangement) where pixel 4 formed with a combination of the sub pixels 3R and 3G, and the pixel 4 formed with a combination of the sub pixels 3G and 3B are alternately disposed in the column direction or in the row direction.

For example, in a case where the bank BK1$b$ includes a single resin layer, the height h1$b$ of the bank BK1$b$ is, for example, set to be greater than the height h1$a$ of the bank BK1$a$ within the range enabling formation of the bank BK1$b$ with a single resin layer. In a case where the banks BK1$a$ and BK2 each include a single resin layer, the height h1$a$ and the height h1$b$ are, for example, set to satisfy h1$a$<h1$b$ within the range from 1 μm to 2.5 μm. In a case where the bank BK1$a$ is formed with a single resin layer and the bank BK1$b$ is formed with a plurality of resin layers, the height h1$a$ is, for example, within the range from 1 μm to 2.5 μm, and height h1$b$ is, for example, set to be a height from 2 μm to 5 μm (however, h1$a$<h1$b$).

As described above, the organic layer 32 is formed by, for example, applying ink containing a photosensitive resin onto the first inorganic layer 31 by an ink-jet method, and then curing the ink with UV light. When the organic layer 32 is cured, the organic layer 32 undergoes cure contraction.

Accordingly, to improve adhesion between the first inorganic layer 31 and the organic layer 32, it is effective to increase real contact area between the first inorganic layer 31 and the organic layer 32 with respect to the apparent surface area of the organic EL substrate 2 (namely, the area of organic EL substrate 2 when the organic EL substrate 2 is viewed from directly above).

In the present embodiment, as illustrated in FIG. 1A and FIG. 1B, the bank BK in the display region 5 is formed with the bank BK1$a$ and the bank BK1$b$ having a height greater than the height h1$a$ of the bank BK1$a$, and accordingly it is possible to increase irregularities in the bank BK serving as a base of the sealing film 30, as compared to the case where the bank BK in the display region 5 has a uniform height equal to the height of the bank BK1$a$. Such irregularities in bank BK are also reflected on the first inorganic layer 31. As a result, it is possible to increase the contact area between the first inorganic layer 31 and the organic layer 32 formed on the bank BK with respect to the apparent surface area of the organic EL substrate 2. Consequently, it is possible to improve adhesion between the first inorganic layer 31 and the organic layer 32 more than in the related art.

Moreover, the height h2 of the bank BK2, a height h3 of the bank BK3, a height h4 of the bank BK4 and a height h5 of the bank BK5 are each formed to be the same height as, for example, the height h1$b$ of the bank BK1$b$. The banks BK2 to BK5 define an edge of the organic layer 32 by gradually decreasing a flow rate of a liquid organic insulating material (ink) serving as a material of the organic layer 32 and by controlling wetting and spreading of the organic insulating material when a film of the organic layer 32 is formed.

Particularly, the dot shaped banks BK2a and BK3a uniformly arrange an edge of a liquid organic insulating material constituting the organic layer 32 and wetting and spreading after the organic insulating material is applied by an ink-jet method or the like, and the banks BK2a and BK3a also suppress a flow of the organic insulating material wetting and spreading.

The organic insulating material constituting organic layer 32 wets and spreads from the display region 5 to the outside of the display region 5. In this case, the edge of the organic insulating material enters the bank BK2 not in a straight line but rather in a nonuniformly curved shape.

Then, when the edge of the organic insulating material comes into contact with the dot shaped banks BK2a in a first column (namely, the display region 5 side corresponding to the inner compound side), the organic insulating material follows surfaces of the dot shaped banks BK2a disposed in a column, and flows out from a gap between the dot shaped banks BK2a in the first column toward the dot shaped banks BK2a in a second column. Note that depending on an amount of the organic insulating material, the organic insulating material also follows head portions of the dot shaped banks BK2a, and flows outside of the dot shaped banks BK2a in the first column.

Since the dot shaped banks BK2a are disposed in column at a regular interval, the edge of the organic insulating material that has a nonuniform shape before coming into contact with the dot shaped banks BK2a in the first line comes into contact with the surfaces of the dot shaped banks BK2a in the first column, and accordingly the shape of the edge of the organic insulating material is uniformly arranged to nearly become a straight line.

When the edge of the organic insulating material having flowed outside of the dot shaped banks BK2a in the first line comes into contact with the dot shaped banks BK2a in the second column (namely, the bank BK3 side corresponding to the outer compound side), the organic insulating material follows the surfaces of the dot shaped banks BK2a, and flows out from a gap between the dot shaped banks BK2a toward the bank BK3.

Since the dot shaped banks BK2a in the first column and the dot shaped banks BK2a in the second column are disposed in a zig zag pattern (alternately), the organic insulating material being in contact with the dot shaped banks BK2a in the first column flows out from a gap between the dot shaped banks BK2a in the first column to be separated into two at the dot shaped banks BK2a in the first column. Subsequently, the organic insulating material having flowed out from a gap between dot shaped banks BK2a in the first column converges with the organic insulating material having flowed out from a gap adjacent to the gap and present between the dot shaped banks BK2a in the first column, and then comes into contact with the dot shaped banks BK2a in the second column. Then, the organic insulating material having flowed out from a gap between the dot shaped banks BK2a in the second column to be separated into two at the dot shaped banks BK2a in the second column converges again with the organic insulating material having flowed out from a gap adjacent to the gap and present between the dot shaped banks BK2a in the second column. Consequently, even when an amount of each of these organic insulating materials flowing through a gap between the dot shaped banks BK2a varies, the variation is mitigated by the gap between the dot shaped banks BK2a. As a result, the shape of the edge of the organic insulating material flowing through a gap between the dot shaped banks BK2a is more uniformly arranged to become nearly a straight line. Moreover, since the dot shaped banks BK2a are disposed in columns at a regular interval, the shape of the edge of the organic insulating material is more uniformly arranged than the shape of the organic insulating material before coming into contact with the dot shaped bank BK2a, and becomes nearly a straight line.

The same also applies to the dot shaped bank BK3. In the above description, the bank BK2, the dot shaped bank BK2a and the bank BK3 can be rephrased as the bank BK3, the dot shaped bank BK3a and the bank BK4 in this order.

Moreover, the organic insulating material passes through the banks BK2 and BK3 to wet and spread, and accordingly the banks BK2 and BK3 function as resistance. Consequently, the organic insulating material passes through the banks BK2 and BK3, and accordingly a speed of wetting and spreading decreases. Thus, according to the present embodiment, the banks BK2 and BK3 are provided closer to the display region 5 side than the bank BK4, and accordingly it is possible to suppress a flow of the organic insulating material, and it is possible to prevent the organic insulating material from overflowing outside of the bank BK4 (particularly, from entering the terminal part 12T).

Moreover, the second organic insulating film pattern part 17B provided with the bank BK3 is separated from the first organic insulating film pattern part 17A, and accordingly the second organic insulating film pattern part 17B is used as the first dam part DM1 configured to prevent moisture from entering the TFT 18 in the first organic insulating film pattern part 17A and the organic EL element 24.

According to the example illustrated in FIG. 1B, the organic insulating material serving as the organic layer 32 is stopped by the bank BK4 to cover the edge on the bank BK3 side in the bank BK4. As a result, the organic layer 32 is in contact with the edge on the bank BK3 side in the bank BK4 via first inorganic layer 31.

The bank BK4 is separated from the first organic insulating film pattern part 17A and the second organic insulating film pattern part 17B, and accordingly the bank BK4 is used as the second dam part DM2 configured to prevent moisture from entering the TFT 18 in the first organic insulating film pattern part 17A and the organic EL element 24.

The third organic insulating film pattern part 17C provided with the bank BK5 stops the organic insulating material constituting the organic layer 32 when the bank BK4 cannot stop the organic layer 32, and the third organic insulating film pattern part 17C is separated from the first organic insulating film pattern part 17A, the bank BK4 and the second organic insulating film pattern part 17B. Accordingly, the third organic insulating film pattern part 17C is used as the third dam part DM3 configured to prevent moisture from entering the TFT 18 in the first organic insulating film pattern part 17A and the organic EL element 24.

Moreover, the bank BK3 is provided on the second organic insulating film pattern part 17B formed in a frame shape, and accordingly the second organic insulating film pattern part 17B is substantially used as a part of the bank. Consequently, the first dam part DM1 functions as a frame shaped two-step bank including two steps on the second organic insulating film pattern part 17B and the bank BK3. Similarly, the third dam part DM3 functions as a frame shaped two-step bank on the third organic insulating film pattern part 17C and the bank BK5.

According to the present embodiment, as described above, the plurality of banks each formed in a frame shape surrounds the bank BK1 multiple times, and accordingly the plurality of banks control wetting and spreading of the organic insulating material, and irregularities generated by the frame shaped banks increase contact area of the first inorganic layer 31 and the organic layer 32 with respect to apparent surface area of the organic EL substrate 2.

Particularly, in the present embodiment, the banks BK2 and BK3 each having a height greater than the height h1a of the bank BK1a are provided at or near contact end portions of the first inorganic layer 31 and the organic layer 32 in frame region 6. As described above, the banks BK2 to BK5 are each formed to have the same height, for example, as the height of the bank BK1b. Here, for convenience of description, when the bank BK (in the above example, the bank BK1b in display region 5 and the banks BK2 to BK5 in the frame region) among the banks BK provided on the organic EL substrate 2 is referred to as a high bank (high bank part), and the bank BK having a height less than the height of the high bank (in the above example, the bank BK1a in display region 5) among the banks BK provided on the organic EL substrate 2 is referred to as a low bank (low bank part), density of each bank BK per area corresponding to one pixel in a mounting region of each bank BK in the frame region 6 (a proportion of area occupied by each bank BK in the area corresponding to one pixel in a mounting region of each bank BK) is higher than density of banks BK1 per pixel. In other words, the density of each high bank per area corresponding to one pixel in a mounting region of each bank BK in the frame region 6 (a proportion of area occupied by each high bank in the area corresponding to one pixel in a mounting region of each bank BK) is higher than density of banks BK1 per pixel.

Consequently, according to the present embodiment, it is possible to improve adhesion between the first inorganic layer 31 and the organic layer 32 in the frame region 6, and particularly adhesion between the first inorganic layer 31 and the organic layer 32 at or near the contact end portions of the first inorganic layer 31 and the organic layer 32 more than in the related art, and it is possible to prevent film peeling in a contract interface of the first inorganic layer 31 and the organic layer 32.

Moreover, although not illustrated, in the present embodiment, a second electrode 23 is formed to cover the bank BK2 formed along a side provided with the second electrode connection part 7 in the first organic insulating film pattern part 17A.

Consequently, the bank BK2 includes the plurality of dot shaped banks BK2a, and accordingly the second electrode 23 is formed to cross over a step of the dot shaped bank BK2a, and is also formed on a planar portion of a gap between the dot shaped banks BK2a. The bank BK2 includes the plurality of dot shaped banks BK2a, and accordingly even when the height h2 of the bank BK2 is formed to be greater than the height h1a of the bank BK1a as described above, it is possible to secure conduction of the second electrode 23 and the second electrode connection part 7.

Cover Body

As described above, a cover body (not illustrated) is provided on the sealing film 30. The cover body is a functional layer having at least one of a protection function, an optical compensation function and a touch sensor function, and for example, when the organic EL display device 1 is a flexible display device, the cover body may be a protection film configured to function as a support body used when a glass substrate is peeled. Moreover, when the organic EL display device 1 is a display device having rigidity and no foldability, the cover body may be an opposing substrate such as a glass substrate, or a filling layer including a filler (not illustrated) may further be provided between the opposing substrate and the organic EL substrate 2.

Moreover, the cover body may include a functional film such as a polarizing film and a touch sensor film, or may include a polarizing plate, a touch panel and the like.

Production Method of Organic EL Display Device 1

Next, a production method of the organic EL display device 1 will be described below with reference to FIGS. 1A and 1B and FIGS. 4A to 4C.

Figure 4A:
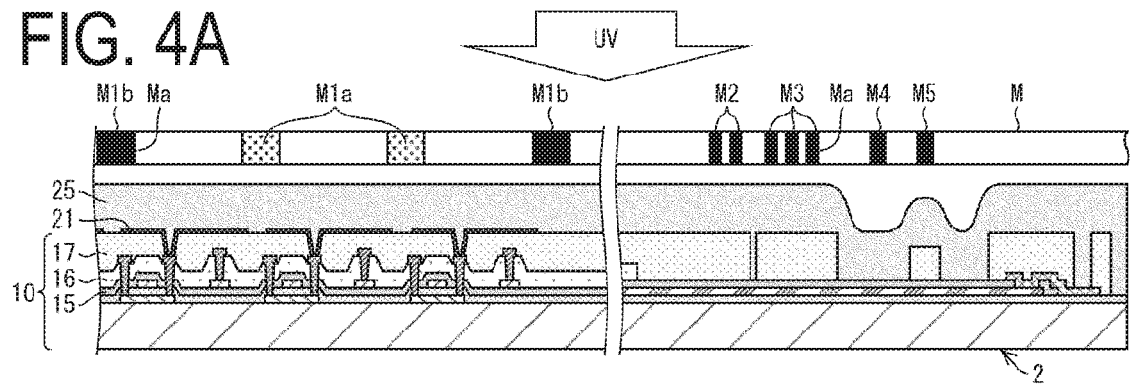
FIGS. 4A to 4C are cross-sectional views illustrating a sequence of steps in a step of producing the main parts of the organic EL display device according to the first embodiment of the disclosure.
Figure 4B:
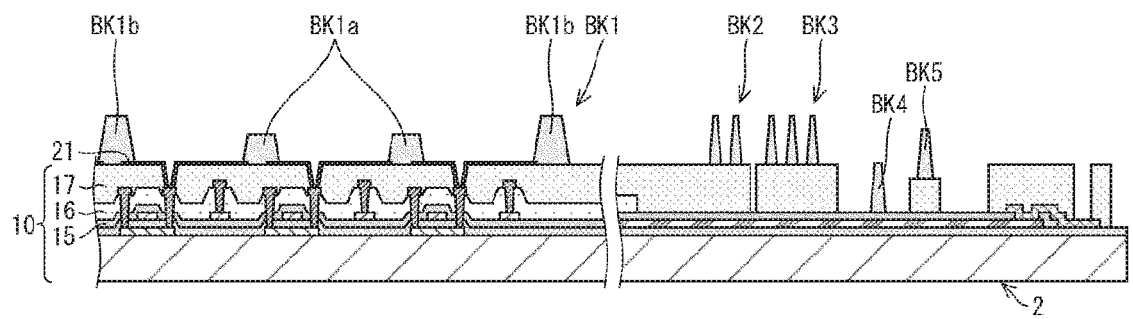
Figure 4C:
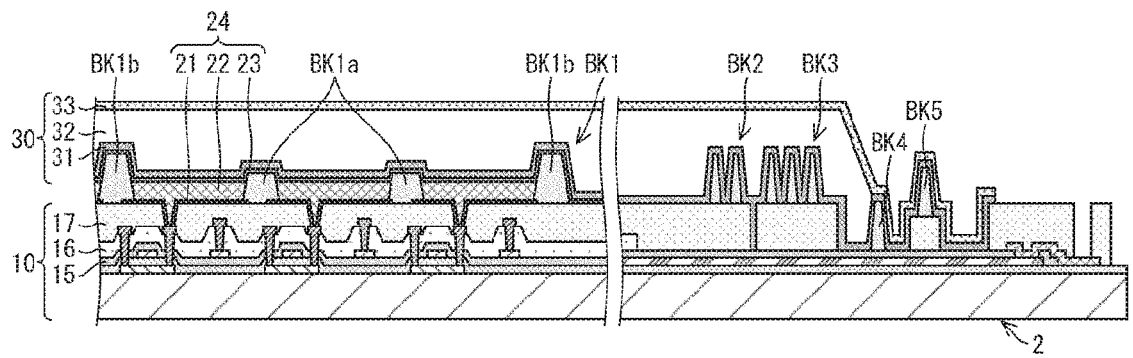

FIGS. 4A to 4C are cross-sectional views each illustrating a sequence of steps in a step of producing main parts of the organic EL display device 1 according to the present embodiment.

First, as illustrated in FIGS. 1A and 1B, the semiconductor layers 13, the gate insulating film 14 formed on the support body 11 to cover semiconductor layers 13, the plurality of gate electrodes G formed on the gate insulating film 14, the plurality of gate wiring lines (not illustrated) formed on the gate insulating film 14, the plurality of routing wiring lines P routed from the terminal part 12T of the TFT layer 12 and formed on the gate insulating film 14, the inorganic insulating film 15 configured to cover the electrodes and wiring lines formed on the gate insulating film 14, the plurality of capacity electrodes C formed on the inorganic insulating film 15, inorganic insulating film 16 formed on inorganic insulating film 15 to cover the capacity electrodes C, the plurality of source electrodes S formed on the inorganic insulating film 16, the plurality of drain electrodes D formed on the inorganic insulating film 16, the plurality of wiring lines W formed on the inorganic insulating film 16, the plurality of source wiring lines (not illustrated) formed on the inorganic insulating film 16, the plurality of power source lines (not illustrated) formed on the inorganic insulating film 16, and the plurality of terminal wiring lines TL provided on the terminal part 12T are formed on the support body 11 by a publicly known method.

Note that when the organic EL display device 1 is a flexible display device, the films of a resin layer (a plastic film) such as a polyimide layer and of a moisture prevention layer constituting support body 11 are formed on a carrier substrate such as a glass substrate, and the above respective layers illustrated in FIGS. 1A and 1B are formed on the films by a publicly known method.

Next, a photosensitive resin such as an acrylic resin and a polyimide resin is applied onto the support body 11 on which the wiring lines are formed, and patterning is carried out by photolithography to form the organic insulating film 17 including the first organic insulating film pattern part 17A to the fourth organic insulating film pattern part 17D. As a result, the TFT substrate 10 is formed.

Then, the first electrode 21 is patterned and formed in a matrix shape by sputtering. A film of the first electrode 21 is formed, for example, at a thickness of 100 nm. In this case, first electrode 21 is connected to the drain electrodes D via a contact hole formed on the organic insulating film 17.

Then, as illustrated in FIG. 4A, the organic film 25 including a positive-working photosensitive resin and the like such as an acrylic resin and a polyimide resin is formed to cover the first electrode 21, the organic insulating film 17 and the inorganic insulating films 15 and 16. The same insulating material as the material for the organic insulating film 17 can be used for the organic film 25. Note that the organic film 25 may be of a single layer, or may be a layered film including a plurality of organic layers layered one on another.

Next, the banks BK1 to BK5 including the organic film 25 are patterned and formed by photolithography or the like.

Specifically, a mask M including an opening Ma configured to open a region between the banks BK adjacent to each other, a covering part M1a configured to cover a formation region of the bank BK1a, a covering part M1b configured to cover a formation region of the bank BK1b, a covering part M2 configured to cover a formation region of the bank BK2, a covering part M3 configured to cover a formation region of the bank BK3, a covering part M4 configured to cover a formation region of the bank BK4, and a covering part M5 configured to cover a formation region of the bank BK5 is disposed opposite the organic film 25. A halftone mask including the covering part M1a as a transflective part and the covering parts M1b and M2 to M5 as light blocking portions and having light transmittance in the opening Ma, light transmittance in the covering part M1a and light transmittance of the covering parts M1b and M2 to M5 differing from one another is used for the mask M.

Then, in the case of irradiation with light such as ultraviolet light (UV light) from the side of the mask M opposite the side on which the organic film 25 is disposed, the organic film 25 is irradiated with light having transmitted each of the opening Ma and the covering part M1a. As a result, a region between the formation regions of respective the banks BK on the organic film 25 is exposed, and a region on the bank BK1a is half exposed. Subsequently, development is carried out, and the organic film 25 in any region other than the formation region of each bank BK among the organic films 25 is removed.

As a result, as illustrated in FIG. 4B, the bank BK1a, and the banks BK1b and BK2 to BK5 each having a height greater than the height h1a of the bank BK1a can be patterned and formed with the same material in the same step.

Note that as a matter of course, bank BK having a different height may be formed by photolithography, double exposure or the like. Moreover, the banks BK1 to BK5 may be formed at separate steps by using masks different from one another.

As described above, the banks BK1a and BK1b are formed such that the height h1b of the bank BK1b is greater than the height h1a of the bank BK1a.

Next, as illustrated in FIG. 1A and FIG. 4C, the organic EL layer 22 is colored corresponding to the sub pixels 3R, 3G and 3B and is vapor-deposited such that a light emitting layer of each color covers the region surrounded by the bank BK1 including the banks BK1a and BK1b (namely, the opening BK1A). A layer thickness of the organic EL layer 22 is, for example, no greater than 250 nm.

Note that a film of the organic EL layer 22 may be formed by any method other than vapor deposition, such as an application method, an ink-jet method and a printing method.

To carry out full color display, as an example, the light emitting layer can be patterned and formed by coloring for each light emission color and by vapor deposition as described above. However, the present embodiment is not limited to this example. To carry out full color display, a system of selecting light emission colors in respective sub pixels 3 by combining the organic EL element 24 of white light emission using a light emitting layer having a light emission color of white (W) with a Color Filter (CF) layer (not illustrated) may be used. Moreover, a system of realizing full color image display by using a light emitting layer having a light emission color of W and by introducing a microcavity structure to each sub pixel 3 may be adopted.

Note that in the case of changing a light emission color of each sub pixel 3 by the method using the CF layer, the microcavity structure or the like, it is not necessary to color the light emitting layer for each sub pixel 3.

Next, the second electrode 23 is formed entirely in the display region 5 on the TFT substrate 10 to cover the organic EL layer 22 and the banks BK1 and BK2. In addition, the second electrode 23 is electrically connected to second electrode connection electrode of the second electrode connection part 7, and is patterned and formed, for example, by vapor deposition using a vapor deposition mask to expose regions other than the organic EL layer 22 and the banks BK1 and BK2. As an example, the second electrode 23 is formed at a thickness of 25 nm.

As a result, the organic EL element 24 including the first electrode 21, the organic EL layer 22 and the second electrode 23 can be formed on the TFT substrate 10.

Then, the sealing film 30 is formed on the TFT substrate 10 on which the organic EL element 24 is formed. Specifically, first, a film of the first inorganic layer 31 including silicon nitride, silicon oxide or the like is formed entirely in the display region 5 and the frame region 6 except on the terminals TM, and on the TFT substrate 10 on which the organic EL element 24 is formed, by CVD or the like to cover the second electrode 23, the organic insulating film 17 except for part of the terminal part 12T, the inorganic insulating film 15 and the bank BK (part of the bank BK2, banks BK3 to BK5) not covered with the second electrode 23 in a plan view. A thickness of the first inorganic layer 31 is, for example, from 500 to 1500 nm.

Next, a liquid organic insulating material (ink) containing a photosensitive resin is applied entirely in the display region 5 by an ink-jet method or the like. The liquid organic material is stopped, for example, by the bank BK4 serving as an organic layer stopper.

Then, the liquid organic insulating material wetting and spreading in a region surrounded by bank BK4 is cured. As a result, a film of the organic layer 32 including an edge along the bank BK4 having a uniform film thickness is formed. A thickness of the organic layer 32 is, for example, from 4 to 12 μm.

Subsequently, an inorganic insulating film including silicon nitride, silicon oxide or the like is formed by CVD or the like on the organic layer 32 and the first inorganic layer 31, and accordingly a film of the second inorganic layer 33 is formed entirely in the display region 5 and the frame region 6 except on the terminals TM. A thickness of the second inorganic layer 33 is, for example, from 500 to 1500 nm. As a result, the sealing film 30 including the first inorganic layer 31, the organic layer 32 and the second inorganic layer 33 is formed.

Subsequently, for example, a cover film or the like (not illustrated) is applied as a cover body on the sealing film 30.

Note that when the organic EL display device 1 is a flexible display device, an interface between a carrier substrate and a resin layer is subsequently irradiated with a laser beam from the rear face side of the carrier substrate (namely, the face side opposite a formation face of the TFT layer 12) to cause ablation, and accordingly the carrier substrate is peeled on the interface. In this case, the cover film functions as a support body used when the carrier substrate is peeled. Subsequently, for example, a transparent plastic film is applied as a lower face film onto a peeling face of the carrier substrate in the resin layer, and accordingly a flexible organic EL display device is produced as the organic EL display device 1.

Note that a polarizing plate film and a phase difference plate film, or a touch sensor film and the like may be applied onto the cover film.

Peeling Test

Next, results of a peeling test (cut and peel test) to evaluate adhesion between the sealing film 30 and the support body 11 will be described.

The pealing test was carried out by the following procedure in accordance with JIS K5400-8.5.

First, films of the first inorganic layer 31, the organic layer 32 and the second inorganic layer 33 were formed in this order as the sealing film 30 on the support body 11 provided with the TFT layer 12 and the bank BK.

Note that CVD was used for forming the films of the first inorganic layer 31 and the second inorganic layer 33. Moreover, an ink-jet method was used for forming the film of the organic layer 32, and the film of the second inorganic layer 33 was formed on the organic layer 32 after the organic layer 32 was cured with UV light. SiN (silicon nitride) was used for materials of the first inorganic layer 31 and the second inorganic layer 33, and an epoxy resin was used for a material of the organic layer 32. A glass substrate was used for the support body 11.

Then, a region measuring 10 mm square in the sealing film 30 was cut with a cutter in a lattice shape having a pitch of 1 mm, to prepare a total of 100 grids of 1 mm×1 mm.

Subsequently, an adhesive tape was applied in the region constituting the grids on the sealing film 30 of the test sample without entrapment of air bubbles and foreign objects, and the adhesive tape was caused to adhere to the sealing film 30 by scraping a surface of the adhesive tape with an eraser. Subsequently, an end of the adhesive tape was picked to swiftly peel the adhesive tape from the test sample, and the number of the grids remaining without peeling was counted to evaluate adhesion of the sealing film 30.

A cellophane adhesive tape manufactured by Nichiban Co., Ltd. and having a tape width of 18 mm and adhesive force of 3.93 N/10 mm was used for the adhesive tape in the peeling test. Here, the adhesive force means the force generated when an adhesive tape is applied to a stainless steel plate, pulled at 180° and peeled.

On the other hand, as a comparative sample, films of the first inorganic layer 31, the organic layer 32 and the second inorganic layer 33 were formed in this order in a manner similar to in the case of the test sample on the same blank glass as the support body 11 used for the test sample, and a total of 100 grids of 1 mm×1 mm were prepared in a manner similar to in the case of the test sample. Subsequently, adhesion of the sealing film 30 to the blank glass was evaluated by the same method as the case of the test sample.

As a result, while the number of the grids remaining without peeling of the sealing film 30 was 100 of 100 (100/100) in the test sample, the number of the grids remaining without peeling of the sealing film 30 was 88 of 100 (88/100) in the comparative sample.

From the results, it can be seen that since irregularities are present on an underlayer of the first inorganic layer 31, adhesion of the sealing film 30 increases. In other words, it can be seen that adhesion of the sealing film 30 increases by increasing irregularities with respect to apparent surface area of the support body 11.

According to the present embodiment, bank BK in the display region 5 is formed with the bank BK1a and the bank BK1b having a height greater than the height of the bank BK1a, and accordingly it is possible to increase irregularities of bank BK with respect to apparent surface area of the support body 11 (in other words, apparent surface area of the organic EL substrate 2). As a result, it is possible to increase irregularities of the first inorganic layer 31 with respect to the apparent surface area. As a result, it is possible to improve adhesion of the sealing film 30 more than in the related art.

Advantageous Effects

The organic EL display device 1 according to the present embodiment includes a structure in which the BK1a as a low bank and the bank BK1b as a high bank are intermittently provided in the display region 5 as described above.

According to the present embodiment, the high bank is provided in the display region 5 as described above, and accordingly it is possible to improve adhesion between the first inorganic layer 31 and the organic layer 32, as compared to the case where only the low bank is provided in the display region On the other hand, when only the high bank is disposed in the display region 5, the following problem is likely to occur: when the organic layer 32 is formed by an ink-jet method or the like, a material (for example, ink containing the photosensitive resin) of the organic layer 32 stops on the high bank, and does not uniformly flow onto respective sub pixels 3. As a result, the following problem is likely to occur: since the organic layer 32 suffers from a defect (loss) or becomes partially thin, the display region 5 cannot entirely be leveled and a pixel defect is generated. Such a problem becomes more remarkable, particularly when the organic layer 32 has a small film thickness.

However, according to the present embodiment, since the low bank and the high bank are intermittently provided in the display region and accordingly the material of the organic layer 32 uniformly flows from the low bank onto respective sub pixels 3, it becomes possible to easily level the display region 5 entirely.

First Modification

FIGS. 5A and 5B are plan views each illustrating apex directions of the dot shaped banks BK2a and BK3a each having a planar shape formed in a triangle.

FIG. 2 illustrates the example in which apexes of the dot shaped banks disposed in a zig zag pattern are disposed in a direction toward the bank BK4 as illustrated in FIG. 5A. However, the present embodiment is not limited to this example, and the apexes of respective dot shaped banks BK2a and BK3a may be disposed in a direction toward the side opposite the bank BK3 as illustrated in FIG. 5B.

Second Modification

Moreover, FIG. 2, FIGS. 5A and 5B and the like illustrate an example in which each of the dot shaped banks BK2a and BK3a is a dot shaped bank formed in a triangle pole shape having a planar shape formed in a triangle. However, the present embodiment is not limited to this example.

FIGS. 6A to 6D are plan views each illustrating an example of a planar shape of the bank BK2.

Figures 6A, 6B, 6C, 6D:
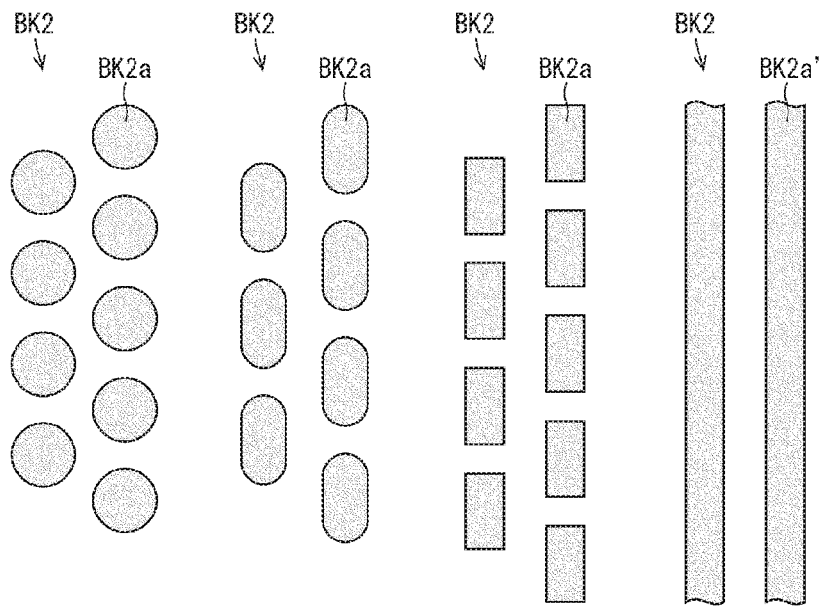
FIGS. 6A to 6D are plan views illustrating examples of a planar shape of a first frame shaped bank.

As illustrated in FIG. 6A, the bank BK2 may have a planar shape formed with a plurality of dot shaped banks BK2a formed in a circular hemisphere shape or a columnar shape, or as illustrated in FIG. 6B, the bank BK2 may have a planar shape formed with a plurality of dot shaped banks BK2*a* formed in an elliptical semi-ellipsoid sphere shape or an elliptical columnar shape, or as illustrated in FIG. 6C, the bank BK2 may have a planar shape formed with a plurality of dot shaped banks BK2*a* formed in a rectangular square columnar shape. Moreover, the bank BK2 is not necessarily formed with a plurality of dot shaped banks BK2*a*, and as illustrated in FIG. 6D, a plurality of linear shaped banks BK2' formed in continuous line may be formed in a multiple frame shape.

Note that FIGS. 6A to 6D illustrate the bank BK2 as an example, for convenience of illustration; however, the bank BK3 is similar to the bank BK2, and in FIGS. 6A to 6D and the above description, the bank BK2 and the dot shaped bank BK2*a* can be read as the bank BK3 and the dot shaped bank BK3*a*, respectively.

Third Modification

Figure 7:
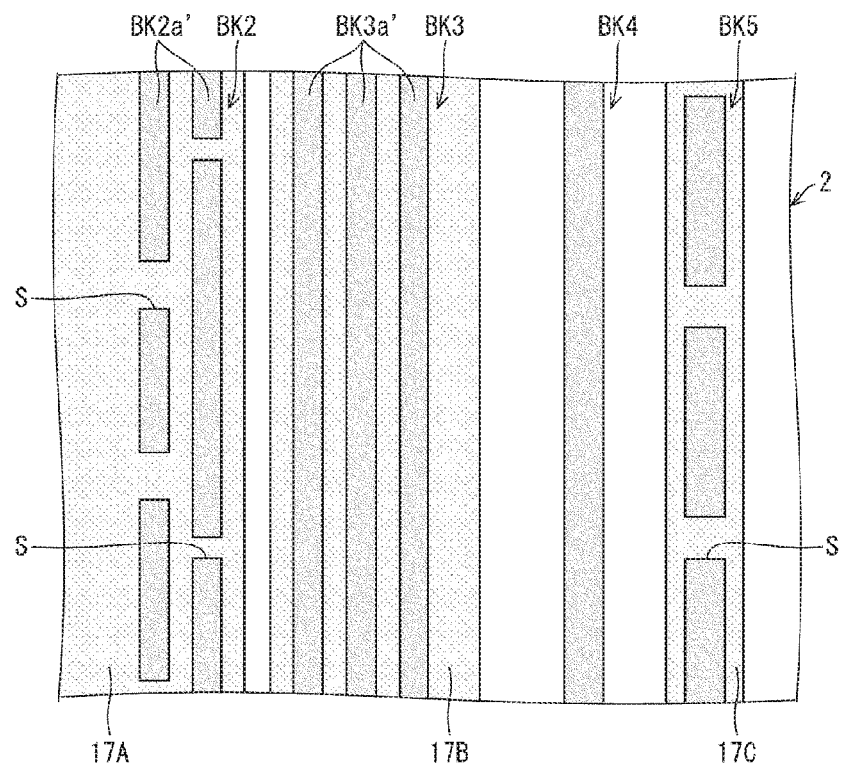
FIG. 7 is a plan view illustrating an example of a planar shape of a bank provided in a frame region in an organic EL substrate according to a third modification of the first embodiment of the disclosure.

FIG. 7 is a plan view illustrating an example of planar shapes of the banks BK2 to BK5 in the organic EL substrate 2 according to the present modification.

As illustrated in FIG. 7, the banks BK2 to BK5 may each be formed in a linear shape.

Moreover, respective banks BK2 to BK5 may be provided partially with slits S. FIG. 7 illustrates an example in which bank BK2 provided in the first organic insulating film pattern part 17A includes a plurality of linear shaped banks BK2*a'* formed in a multiple frame shape (for example, a double frame shape); the bank BK3 provided in second organic insulating film pattern part 17B includes a plurality of linear shaped banks BK3*a'* formed in a multiple frame shape (for example, a triple frame shape); the bank BK4 and the bank BK5 provided in third organic insulating film pattern part 17C include banks each formed in a linear shaped single frame shape (a single frame shape) bolder than each of the linear shaped banks BK2*a'* and BK3*a'*; and slits S are formed in the linear shaped banks BK2*a'* and bank BK5, respectively.

However, bank BK in which slits S are formed may be provided on any bank other than the linear shaped banks BK2*a'* and BK5, and may be provided any of the banks BK2 to BK5.

However, the banks BK4 and BK5 need to stop an organic insulating material used for the organic layer 32. Consequently, the banks BK4 and BK5 may be provided with slits S, but at least one of the banks BK4 and BK5 is desirably provided with no slit S. Note that when the bank BK4 or the bank BK5 is provided with slits S, a slit width of slit S for partition of the banks BK4 and BK5 (namely, a width of slit S in a direction orthogonal to the linear shaped banks BK4 and BK5) may be set at a width at which the organic insulating material does not overflow from slit S due to surface tension. Note that as described above, the banks BK2 and BK3 can be formed with the dot shaped banks BK2*a* and BK3*a*; the linear shaped banks BK2*a'* and BK3*a'* may each be formed in an island shape; and the slit width in each of the banks BK2 and BK3 is not limited to the above width.

Moreover, as described above, when slits S are formed in the bank BK, slits S in the banks BK adjacent to each other are desirably positioned alternately without being adjacent to one another, as in FIG. 7 illustrating respective linear shaped banks BK2*a'* in the bank BK2.

Fourth Modification

Moreover, for example, FIG. 3 illustrates the example in which the bank BK1*b* as a high bank is provided in a linear shape along the column direction at the boundary between the pixels 4 in the row direction.

However, the present embodiment is not particularly limited to the above example, and the high bank may be formed in any manner as long as the high bank is intermittently formed.

FIG. 8 to FIGS. 10A and 10B are plan views each illustrating an example of disposition of the banks BK1*a* and BK1*b* in the display region 5 of the organic EL display device 1 according to the present modification. Note that also in FIG. 8 to FIGS. 10A and 10B, as in FIG. 3, for convenience of illustration, steps generated by upper faces and end faces of the banks BK1*a* and BK1*b*, and steps generated by a difference in the heights of the banks BK1*a* and BK1*b* are not illustrated.

For example, the bank BK1*b* is provided in a linear shape along the column direction with at least one (one in the example illustrated in FIG. 8) pixel sandwiched in the row direction, and is also provided in a linear shape along the row direction with at least one (three in the example illustrated in FIG. 8) pixel sandwiched in the column direction and in the row direction. Accordingly, the bank BK1*b* may be formed in a lattice shape surrounding at least one pixel 4.

Figure 8:
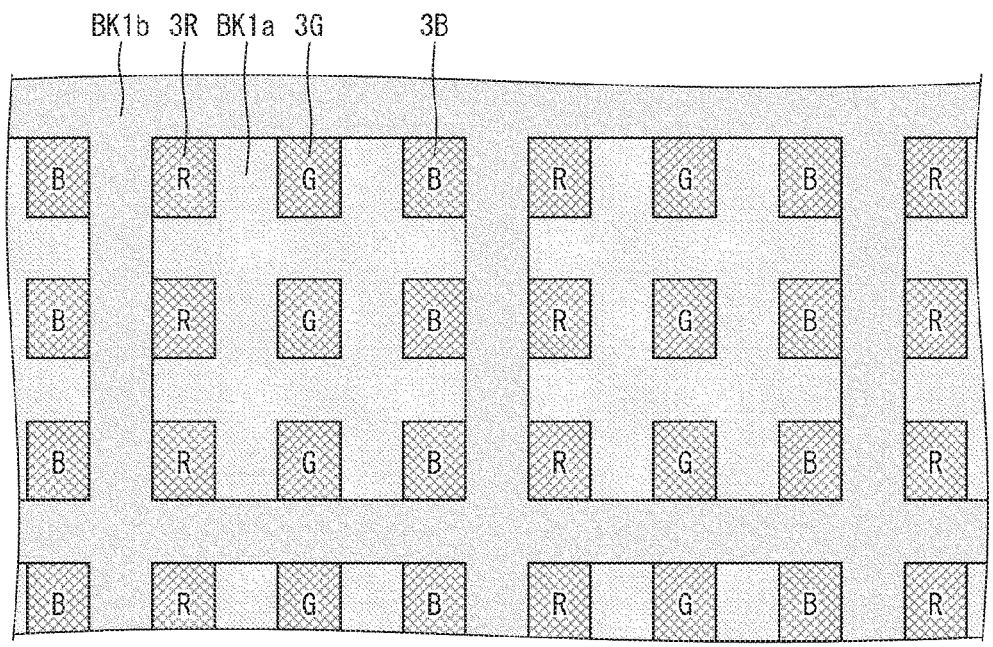
FIG. 8 is a plan view illustrating an example of disposition of a high bank and a low bank in a display region of an organic EL display device according to a fourth modification of the first embodiment of the disclosure.

For example, as illustrated in FIG. 8, the bank BK1*b* is provided in a linear shape along the column direction at the boundary between the pixels 4 in the row direction, and is also provided in a linear shape along the row direction for each of a plurality (three in the example illustrated in FIG. 8) of the pixels 4 arranged in the column direction. Accordingly, the bank BK1*b* may be formed in a lattice shape surrounding the plurality (three in the example illustrated in FIG. 8) of the pixels 4 arranged in the column direction.

Moreover, in a case where the second electrode 23 is formed on the bank BK1 such that the second electrode 23 covers the bank BK1 as illustrated in FIG. 1A, when the bank BK1*b* is seamlessly formed, conduction of the second electrode 23 on bank BK1*b* may become difficult to establish depending on the height of the bank BK1*b* and a pitch between the banks BK1*b* adjacent to each other.

Figure 9:
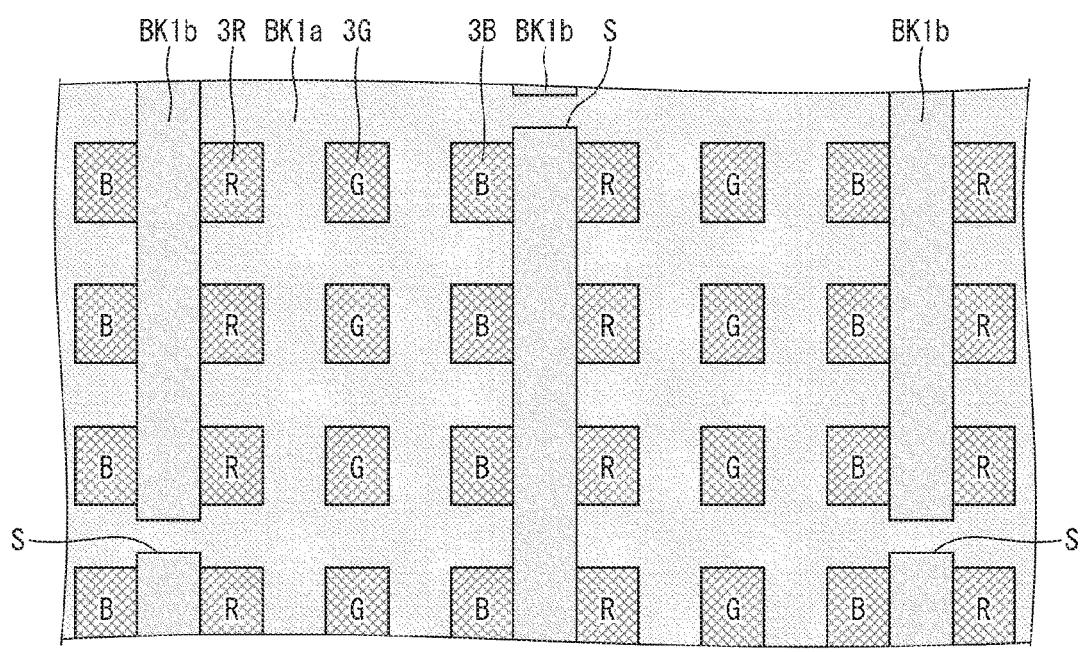
FIG. 9 is a plan view illustrating another example of disposition of the high bank and the low bank in the display region of the organic EL display device according to the fourth modification of the first embodiment of the disclosure.
Figure 10A:
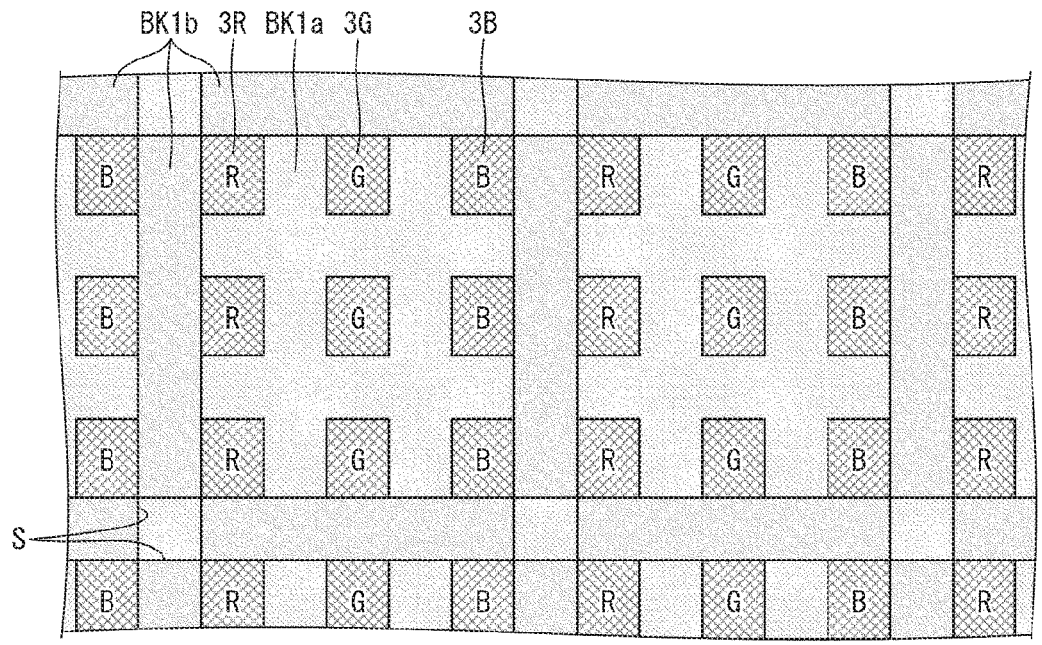
FIGS. 10A and 10B are plan views illustrating yet another example of disposition of the high bank and the low bank in the display region of the organic EL display device according to the fourth modification of the first embodiment of the disclosure.
Figure 10B:
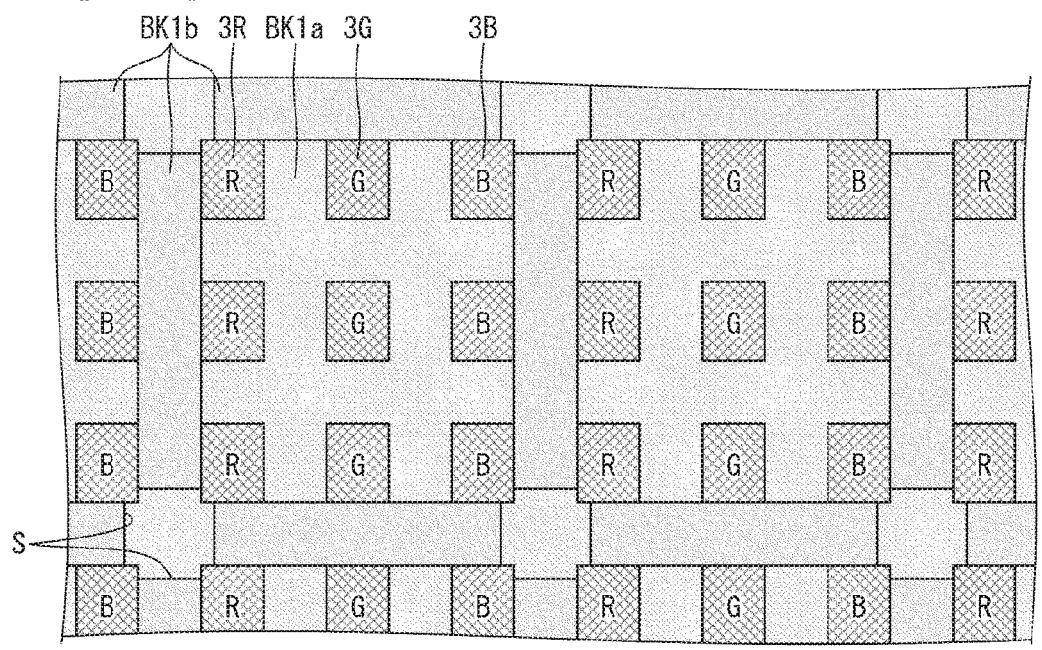

Therefore, for example, as illustrated in FIG. 9, the bank BK1*b* may have a configuration in which the bank BK1*b* illustrated in FIG. 3 is provided with slit S to establish conduction of the second electrode 23, or as illustrated in FIGS. 10A and 10B, the bank BK1*b* may have a configuration in which bank BK1*b* illustrated in FIG. 8 is provided with slit S to establish conduction of the second electrode 23.

Note that portions other than the high bank part in the bank BK1 correspond to the low bank part, and a bank having the same height as a height of the low bank part is provided in a portion of slit S in the bank BK1. In other words, slit S is provided with the bank BK1*a*.

Note that FIG. 10A illustrates the example in which slit S has a square shape. However, in view of a taper or the like of bank BK1*b*, as illustrated in FIG. 10B, the banks BK1*a* and BK1*b* are more desirably formed such that a length of the bank BK1*b* is less than, for example, a length of three sub pixels illustrated in FIG. 10A and slit S is formed in a cross shape.

Note that the present embodiment is not limited to the above examples, and the bank BK1*b* may be provided in any manner as long as the bank BK1*b* is intermittently provided. For example, the bank BK1*a* and the bank BK1*b* may be provided alternatively every sub pixel 3 adjacent to each other, or the bank BK1*b* may be formed to sandwich two sub pixels 3 in the row direction or in the column direction.

Moreover, the example in which any of the banks BK2 to BK5 in the frame region 6 includes a high bank is described above; however, the banks BK2 to BK5 in the frame region 6 may include a high bank and a low bank, or a high bank may also be formed intermittently in the frame region 6. For example, the bank BK2 and bank BK3 may differ in height, or the bank BK2 may be formed with the dot shaped banks BK2a having different heights for each column. Similarly, the bank BK3 may be formed with the dot shaped banks BK3a having different heights for each column.

Moreover, the example in which any of the banks BK2 to BK5 are formed to have the same height as the height of the bank BK1b is described above; however, while the first dam part DM1 and the third dam part DM3 are substantially used as banks and the bank BK is formed on the organic insulating film 17, the second dam part DM2 is not provided with the organic insulating film 17 on the lower layer of the bank BK4. Consequently, it can be said that the frame region 6 is also substantially provided with banks having different heights. Thus, the height of a bank may be adjusted by the organic insulating film 17.

Fifth Modification

FIG. 1A illustrates the example in which the second electrode 23 is a common electrode provided commonly to all sub pixels 3. However, the present embodiment is not limited to this example, and the second electrode 23 may be a pattern electrode formed in an island shape for each sub pixel 3, and the second electrodes 23 each patterned in an island shape may be connected to one another via auxiliary wiring (not illustrated) or the like.

Sixth Modification

As described above, in the present embodiment, the organic EL display device 1 including the organic EL element 24 (OLED element) as a light emitting element is described as an example of the display device according to the present embodiment. However, the present embodiment is not limited to this example, and the light emitting element may be an inorganic EL element, or may be a Quantum-dot Light Emitting Diode (QLED) element.

Second Embodiment

Another embodiment of the disclosure will be described mainly with reference to FIGS. 11A and 11B and FIG. 12. Note that differences from the first embodiment will be described in the present embodiment, and components having the same functions as the components described in the first embodiment are given the same reference signs and description of these components will be omitted.

Schematic Configuration of Organic EL Display Device

Figure 11A:
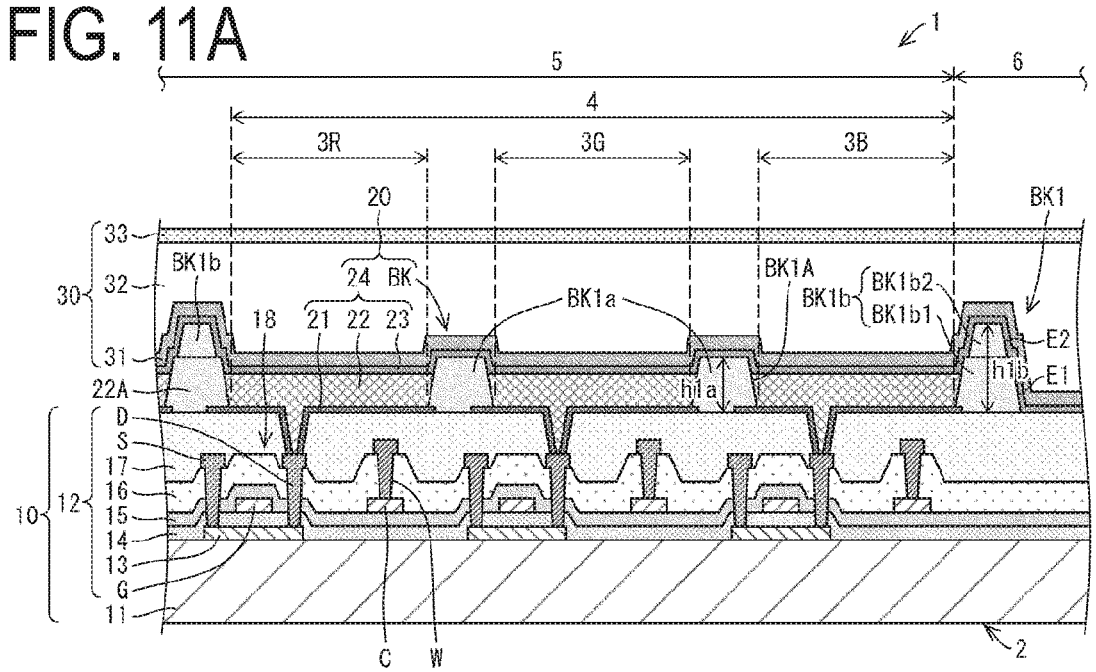
FIG. 11A is a cross-sectional view illustrating an example of a schematic configuration of a display region and a vicinity of the display region of an organic EL display device according to a second embodiment of the disclosure.
Figure 11B:
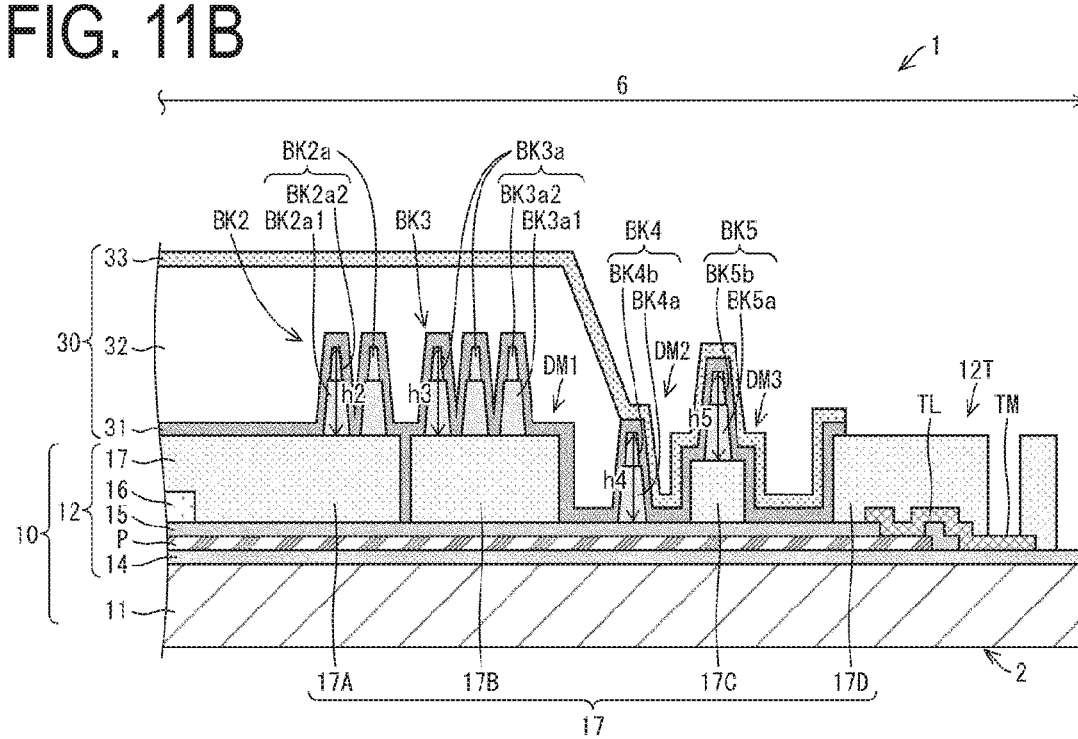
FIG. 11B is a cross-sectional view illustrating an example of a schematic configuration of a frame region of the organic EL display device according to the second embodiment of the disclosure.

FIG. 11A is a cross-sectional view illustrating an example of a schematic configuration of the display region 5 and a vicinity of the display region 5 of the organic EL display device 1 according to the present embodiment, and FIG. 11B is a cross-sectional view illustrating an example of a schematic configuration of the frame region 6 of the organic EL display device 1 according to the present embodiment.

The organic EL display device 1 illustrated in FIGS. 11A and 11B is different from the organic EL display device 1 according to the first embodiment in that at least part of bank BK is formed in a step shape including a plurality of steps (step parts).

In the example illustrated in FIGS. 11A and 11B, while each of the banks BK1b to BK5 includes a two-step bank including a layered structure (two-layered structure, two-step structure) formed in a tapered shape including two steps of an upper step part and a lower step part, the bank BK1a includes a single-step bank including a monolayer structure (single-layered structure, single-step structure) having no step and having the same height as a height of the lower step part of each of the banks BK1b to BK5.

Specifically, the bank BK1b includes a layered structure including an upper step part BK1b2 layered on a lower step part BK1b1. Each dot shaped bank BK2a in the bank BK2 includes a layered structure including the upper step part BK2a2 layered on the lower step part BK2a1. Each dot shaped bank BK3a in the bank BK3 includes a layered structure including the upper step part BK3a2 layered on the lower step part BK3a1. The bank BK4 includes a layered structure including the upper step part BK4b layered on the lower step part BK4a. The bank BK5 includes a layered structure including the upper step part BK5b layered on the lower step part BK5a.

The bank BK1a and the lower step parts BK1b1, BK2a1, BK3a1, BK4a and BK5a (lower step bank) include, for example, a first resin layer E1, and the upper step parts BK1b2, BK2a2, BK3a2, BK4b and BK5b (upper step bank) include, for example, a second resin layer E2.

The end faces of the upper step parts BK1b2, BK2a2, BK3a2, BK4b and BK5b are disposed behind the end faces (peripheral end faces) of the lower step parts BK1b1, BK2a1, BK3a1, BK4a and BK5a. Consequently, the openings of first resin layer E1 constituting the bank BK1a and lower step part BK1b1 serve as light emitting regions of respective sub pixels 3 in the display region 5.

Note that a distance between an end face of the first resin layer E1 and an end face of the second resin layer E2, in other words, a distance between an edge (peripheral portion) of the first resin layer E1 on an upper face of the first resin layer E1 and a contact part of the first resin layer E1 with the second resin layer E2 is not particularly limited. The edge of the first resin layer E1 on the upper face of the first resin layer E1 and the contact part of the first resin layer E1 with the second resin layer E2 may be separated from each other such that each bank BK includes a plurality of steps.

Moreover, neither a taper angle of the end face of the first resin layer E1 nor a taper angle of the end face of the second resin layer E2 is particularly limited.

For example, a publicly known photosensitive resin having an insulation property such as an acrylic resin and a polyimide resin can be used as a first resin and a second resin used for the first resin layer E1 and the second resin layer E2.

In the present embodiment, a resin (first resin, in other words, a resin having a Critical Dimension (CD) loss less than a CD loss of a resin used for the second resin layer E2) more difficult to develop than a resin used for the second resin layer E2 is used for a material of the first resin layer E1, and a resin (second resin, in other words, a resin having a CD loss greater than a CD loss of a resin used for the first resin layer E1) easier to develop than a resin used for the first resin layer E1 is used for a material of the second resin layer E2. Specifically, in the present embodiment, a resin having a development speed greater than a development speed of a resin used for the first resin layer E1 is used for a material of the second resin layer E2.

In the present embodiment, the organic EL layer 22 and the second electrode 23 provided between the banks BK1 (in other words, in the opening BK1A serving as a light emitting region) are provided below an upper face of the lower step part BK1b1 of the bank BK1b.

As described in the first embodiment, the bank BK1a is formed at a height of, for example, 1 μm to 2.5 μm. Therefore, the lower step part BK1b1 of the bank BK1b is formed at a height of, for example, 1 μm to 2.5 μm.

Moreover, as described in the first embodiment, the bank BK1b is formed at a height of, for example, 2 μm to 5 μm. Therefore, the upper step part BK1b2 of the bank BK1b is formed at a height of, for example, 1 μm to 2.5 μm.

Moreover, as described in the first embodiment, a film of the first electrode 21 is formed at a thickness of, for example, 100 nm. A film of the organic EL layer 22 is formed at a thickness of, for example, 250 nm or less. As an example, the second electrode 23 is formed at a thickness of, for example, 25 nm. The thickness of the first inorganic layer 31 is, for example, from 500 to 1500 nm.

Thus, in the present embodiment, the organic EL layer 22 and the second electrode 23 provided between the banks BK1 are provided below the upper face of the lower step part BK1b1 of the bank BK1b, and accordingly the first inorganic layer 31 on the sealing film 30 includes a plurality of steps, corresponding to the bank BK1b serving as a base of the sealing film 30.

Production Method of Organic EL Display Device 1

The organic EL display device 1 can be produced by a method similar to in the first embodiment and by using, as the organic film 25 illustrated in FIG. 4A, an organic film 25 including the first resin and the second resin differing in a development speed and layered one on another.

Advantageous Effects

Figure 12:
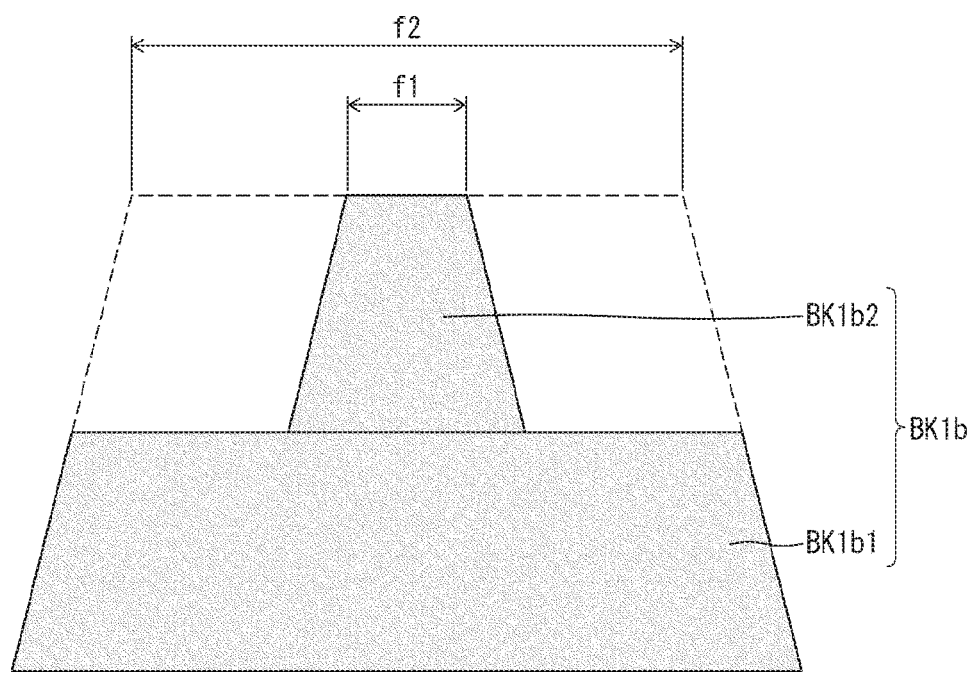
FIG. 12 is an explanatory view explaining an effect due to a high bank formed as a two-layered structure including a step.

FIG. 12 is an explanatory view explaining an effect due to the bank BK1b formed as a two-layered structure including a step.

As indicated by dotted lines in FIG. 12, a width f1 of the upper face on the bank BK1b formed as a two-layered structure including a step is less than a width f2 (a width in a transverse direction of the bank BK1b) of the upper face (the highest portion of the bank) on the bank BK1b formed with a single step (for example, a single layer).

Consequently, the bank BK1b is formed as a two-layered structure including a step, and accordingly area of the upper face of the bank BK1 reduces and a material (for example, ink) of the organic layer 32 becomes difficult to stop on the upper face of the bank BK1b, as compared to the case where the bank BK1b is formed with a single step (for example, a single layer).

Moreover, an area occupied by the bank BK1b reduces as indicated by dotted lines in FIG. 12, and accordingly even when the organic layer 32 having the same film thickness is formed, volume occupied by a material (for example, ink) of the organic layer 32 increases with respect to apparent surface area. As a result, when the organic layer 32 is formed by ink jet or the like, droplets (ink) can be dropped at a high density onto the TFT substrate 10 on which the bank BK1b is formed. Consequently, since the organic layer 32 is difficult to suffer from a defect (loss) and can easily be formed entirely in the display region 5, a pixel defect can be difficult to generate.

Moreover, according to the present embodiment, the bank BK1b includes a two-layered structure including a step as described above, and accordingly irregularities of bank BK can be increased by increasing the height h1b of the bank BK1b to a height that cannot be obtained by a single resin layer (namely, a single layer). Consequently, it is possible to further increase irregularities in the bank BK serving as a base of the sealing film 30, as compared to in the first embodiment. Such irregularities of the bank BK are also reflected on the first inorganic layer 31. As a result, contact area of the first inorganic layer 31 with the organic layer 32 formed on the bank BK can be increased with respect to apparent surface area of the organic EL substrate 2.

Consequently, it is possible to further improve adhesion between the first inorganic layer 31 and the organic layer 32.

First Modification

In the present embodiment, as illustrated in FIGS. 12A and 12B, the example in which the banks BK1b to BK5 each include a two-layered structure including the first resin layer E1 and the second resin layer E2 is described. However, the present embodiment is not limited to this example. The banks BK1b to BK5 may be formed with a plurality of resin layers differing in a development speed, or may include a layered structure including three or more resin layers.

Note that when the banks BK1b to BK5 each include a layered structure including three or more resin layers, bank BK1a may include a layered structure including the number of steps less than the number of steps in each of the banks BK1b to BK5 (namely, a small height).

Thus, the plurality of resin layers differing in a development speed is layered one on another with a resin layer having a greater development speed as an upper layer, and accordingly it is possible to form step shaped bank BK including a plurality of steps (tapered shaped bank BK including steps).

Second Modification

Moreover, in the present embodiment, as described above, the example in which any of the banks BK2 to BK5 in frame region 6 includes a high bank including a two-step structure (two-step bank) is described. However, the banks BK2 to BK5 in the frame region 6 may include a high bank and a low bank, or for example, the two-step back may also be formed as a high bank intermittently in the frame region 6.

Consequently, all of the banks BK2 to BK5 in the frame region 6 may include a two-step bank, or may include a single-step bank and a two-step bank. Note that even when the banks BK2 to BK5 include a single-step bank and a two-step bank, density of the high bank per area corresponding to one pixel in a mounting region of each bank BK in the frame region 6 is desirably higher than density of the high bank per pixel in the display region 5.

Third Embodiment

Further another embodiment of the disclosure will be described below with reference to FIGS. 13A and 13B to FIG. 16. Note that differences from the first and second embodiments will be described in the present embodiment, and components having the same functions as the components in the first and second embodiments are given the same reference signs and description of these components will be omitted.

Schematic Configuration of Organic EL Display Device

Figure 13A:
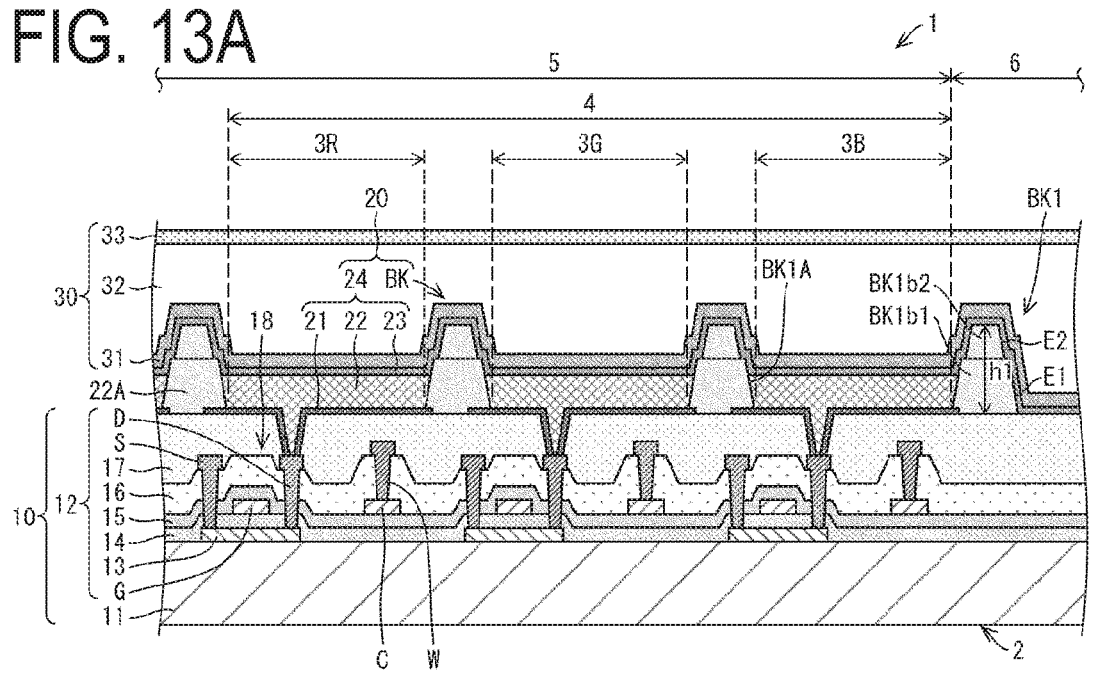
FIG. 13A is a cross-sectional view illustrating an example of a schematic configuration of a display region and a vicinity of the display region of an organic EL display device according to a third embodiment of the disclosure.
Figure 13B:
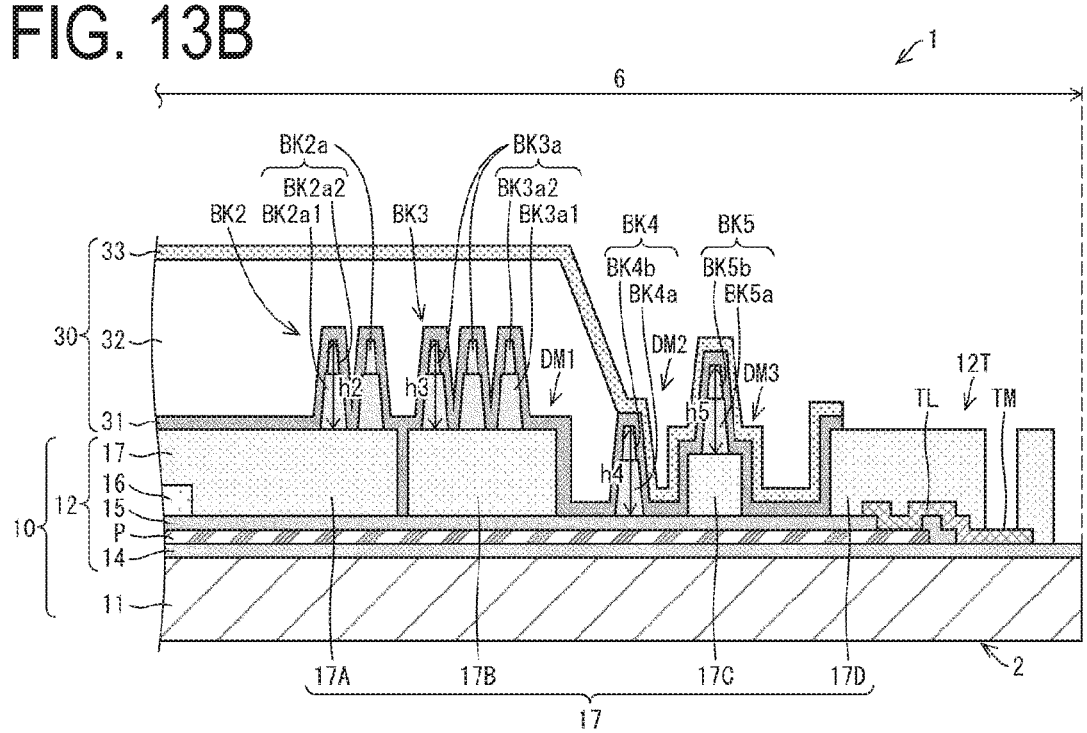
FIG. 13B is a cross-sectional view illustrating an example of a schematic configuration of a frame region of the organic EL display device according to the third embodiment of the disclosure.

FIG. 13A is a cross-sectional view illustrating an example of a schematic configuration of the display region 5 and a vicinity of the display region 5 of the organic EL display device 1 according to the present embodiment, and FIG. 13B is a cross-sectional view illustrating an example of a schematic configuration of the frame region 6 of the organic EL display device 1 according to the present embodiment.

Organic EL display device 1 illustrated in FIGS. 13A and 13B is the same as the organic EL display device 1 according to the second embodiment except that each bank BK is formed at the same height, and that the banks BK is each formed in a step shape including a plurality of steps (step parts).

In the present embodiment, as illustrated in FIG. 13A, any of the banks BK1 includes the same structure as the structure of the bank BK1b illustrated in FIG. 12A. A height h1 of the bank BK1 is set similarly at the height h1b of the bank BK1b. Any of the banks BK1 according to the present embodiment has the same height. Consequently, in the present embodiment, for convenience of description, a lower step part of the bank BK1 is referred to as the lower step part BK1b1, and an upper step part of the bank BK1 is referred to as the upper step part BK1b2. Moreover, the bank BK1 may be referred to as the bank BK1b.

In the present embodiment, the organic EL layer 22 and the second electrode 23 provided between the banks BK1 (in other words, in the opening BK1A serving as a light emitting region) are provided below an upper face of the lower step part BK1b1 of the bank BK1, in the same manner as in the second embodiment.

In the present embodiment, the organic EL layer 22 and the second electrode 23 provided between the banks BK1 are provided below the upper face of the lower step part BK1b1 of the bank BK1, and accordingly the first inorganic layer 31 on the sealing film 30 includes a plurality of steps for each bank BK1, corresponding to the bank BK1 serving as a base of the first inorganic layer 31 in the display region 5. Moreover, each of the banks BK2 to BK5 includes a two-layered structure including steps as described above, and accordingly the first inorganic layer 31 on the sealing film 30 includes a plurality of steps for each bank BK, corresponding to the banks BK2 to BK5 serving as a base of the first inorganic layer 31 in the frame region 6.

Production Method of Organic EL Display Device 1

Figure 14:
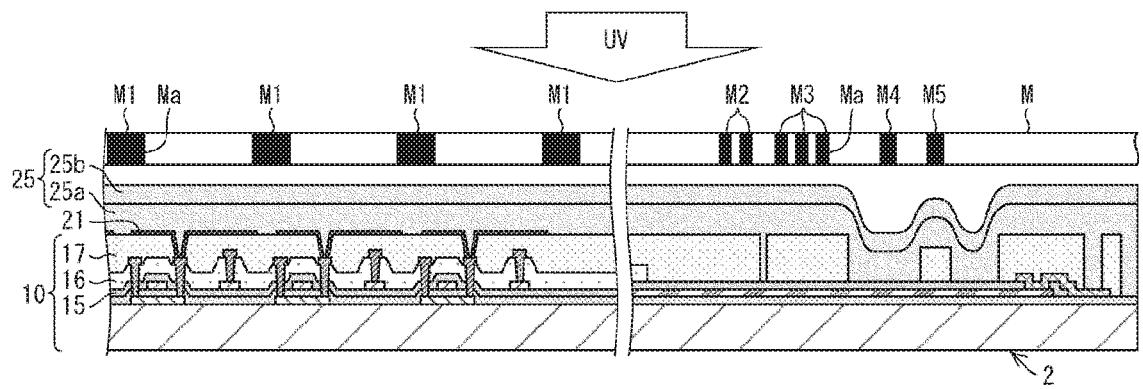
FIG. 14 is a cross-sectional view illustrating a step of producing main parts of the organic EL display device according to the third embodiment of the disclosure.

FIG. 14 is a cross-sectional view illustrating a step of producing main parts of the organic EL display device 1 according to the present embodiment. FIG. 14 corresponds to the step illustrated in FIG. 4A in the first embodiment.

In the present embodiment, as illustrated in FIG. 14, for example, the organic film 25 including a first resin and a second resin differing in a development speed and layered one on another is used as the organic film 25 in a manner similar to in the second embodiment at the step illustrated in FIG. 4A, and instead of a halftone mask, the mask M provided with a light blocking portion, corresponding to the banks BK1 to BK5 is disposed opposite organic film 25. In other words, in the present embodiment, a mask including the covering part M1 configured to cover a formation region of bank BK1 and serving as a light blocking portion in the same manner as the covering parts M2 to M5 is used as the mask M.

As a result, in the present embodiment, in the case of irradiation with light such as UV light (ultraviolet light) from the side of the mask M opposite the side on which the organic film 25 is disposed, the second resin layer E2 as an upper layer is ablated more than the first resin layer E1 as a lower layer, and accordingly each bank BK is formed to include two steps. Note that steps other than the above step are the same as in the first and second embodiments.

Advantageous Effects

According to the present embodiment, as described above, the bank BK1 includes a two-layered structure including steps, and the organic EL layer 22 and the second electrode 23 provided between the banks BK1 are provided below the upper face of the lower step part BK1b1 of the bank BK1. Accordingly, it is possible to increase irregularities of the first inorganic layer 31, as compared to the case where in bank BK serving as a base of the sealing film 30, the bank BK1 does not include a two-layered structure including steps as described above, or the case where the bank BK1 includes a two-layered structure including steps as described above, but the organic EL layer 22 and the second electrode 23 provided between the banks BK1 are provided above the upper face of the lower step part BK1b1 of the bank BK1. As a result, even when two kinds of banks including a high bank and a low bank as described in the first and second embodiments are not provided, contact area of the first inorganic layer 31 with the organic layer 32 formed on the bank BK can be increased with respect to apparent surface area of the organic EL substrate 2. Consequently, it is possible to further improve adhesion between the first inorganic layer 31 and the organic layer 32.

Moreover, according to the present embodiment, in a manner similar to the bank BK1b in the second embodiment, the bank BK1 is formed as a two-layered structure including steps, and accordingly the same effects as the effects described in the second embodiment can be obtained.

First Modification

In the present embodiment, as described above, the example in which the step shaped banks BK1 to BK5 including a plurality of steps are produced by using a plurality of resin layers differing in a development speed is described. However, the present embodiment is not limited to this example. As long as each bank BK can be formed in a step shape including a plurality of steps, a method of forming the bank BK is not limited to the above method.

The bank BK may be formed in a step shape, for example, by carrying out half exposure with a change in an exposure amount on the end portion side and the central portion side of the bank BK to form irregularities on a surface of a photosensitive resin at the time of completion of development. Moreover, the bank BK may be formed in a step shape by repeating film formation and etching.

Second Modification

In the present embodiment, as illustrated in FIGS. 13A and 13B, the example in which each bank BK includes a two-layered structure including the first resin layer E1 and the second resin layer E2 is described. However, the present embodiment is not limited to this example, and each bank BK may include a layered structure including three or more resin layers.

Note that also in the present embodiment, a step shaped bank BK including a plurality of steps can be formed by layering a plurality of resin layers differing in a development speed one on another with a resin layer having a greater development speed as an upper layer.

Third Modification

Figure 15:
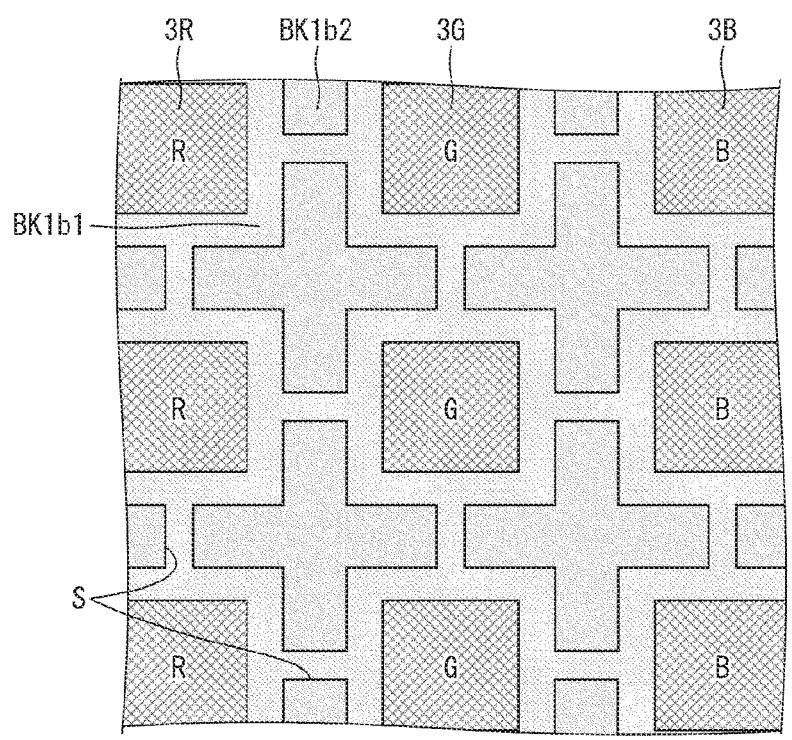
FIG. 15 is a plan view illustrating an example of a shape of an upper step part of a bank in a display region of an organic EL display device according to a third modification of the third embodiment of the disclosure.

FIG. 15 is a plan view illustrating an example of a shape of the upper step part BK1b2 of the bank BK1 in the display region 5 of the organic EL display device 1 according to the present modification.

When all of the banks BK1 are formed to include, for example, a two-step bank as illustrated in FIG. 13A, the upper step part BK1b2 may be provided with slits S configured for partition of the upper step part BK1b2 in a direction orthogonal to the upper step part BK1b2, for example, between the sub pixels 3 adjacent to each other in a row direction and in a column direction, as illustrated in FIG. 15.

As described above, as area of an upper face of the upper step part BK1b2 (upper step bank) of the bank BK1 reduces, area of a flat portion of the upper face of the upper step part BK1b2 reduces, and a flow of a liquid organic insulating material (for example, ink) serving as a material of the organic layer 32 becomes difficult to stop. Note that the liquid organic insulating material overflowing the upper step part BK1b2 of the bank BK1 naturally flows into the lower step part BK1b1 (lower step bank) of the bank BK1.

Consequently, the upper step part BK1b2 is provided with slits S as illustrated in FIG. 15, and accordingly the organic layer 32 uniformly flows onto each sub pixel 3 without stopping on the bank BK1. Consequently, it becomes easy to uniformly form the organic layer 32 on each sub pixel 3.

Moreover, when the upper step part BK1b2 is provided with slits S, the liquid organic insulating material can overflow the lower step part BK1b1 (lower step bank) of the bank BK1 to flow onto the adjacent sub pixel 3. On the other hand, when the upper step part BK1b2 is provided with no slit S, the liquid organic insulating material also has to overflow the upper step bank BK2b2. Consequently, when the upper step part BK1b2 is provided with slits S, there is also the following effect: the liquid organic insulating material becomes easy to flow, as compared to the case where upper step part BK1b2 is provided with no slit S.

Note that FIG. 15 illustrates the example in which the upper step part BK1b2 is provided with slits S between the sub pixels 3 adjacent to each other in the row direction and in the column direction in a planar view. However, the present embodiment is not limited to this example, and the upper step part BK1b2 may be provided with slits S between the sub pixels 3 adjacent to each other in an oblique direction intersecting each of the row direction and the column direction in a planar view.

Fourth Modification

Figure 16:
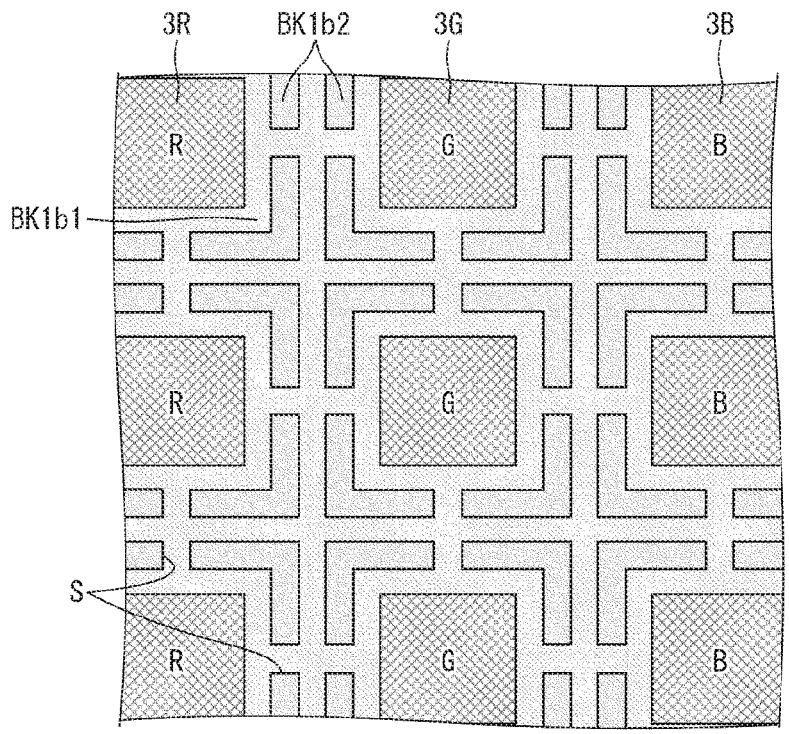
FIG. 16 is a plan view illustrating an example of a shape of an upper step part of a bank in a display region of an organic EL display device according to a fourth modification of the third embodiment of the disclosure.

FIG. 16 is a plan view illustrating an example of a shape of the upper step part BK1b2 of the bank BK1 in the display region 5 of the organic EL display device 1 according to the present modification.

The organic EL display device 1 according to the present modification is the same as, for example, the organic EL display device 1 illustrated in FIG. 15 except that the bank BK1 is configured such that a plurality of columns of upper step parts BK1b2 is provided on the lower step part BK1b1 located among respective sub pixels 3.

As illustrated in FIG. 16, a plurality of columns of upper step parts BK1b2 (upper step banks) can be provided by reducing a width of the upper step part BK1b2 of the bank BK1.

Moreover, when the width of the upper step part BK1b2 of the bank BK1 reduces, the area of a flat portion of an upper face of upper step part BK1b2 of the bank BK1 reduces, and a flow of a liquid organic insulating material (for example, ink) serving as a material of the organic layer 32 becomes difficult to stop.

Consequently, the plurality of columns of upper step parts BK1b2 is provided on the lower step part BK1b1 located among respective sub pixels 3 as illustrated in FIG. 16, and accordingly the organic layer 32 uniformly flows onto each sub pixel 3 without stopping on the bank BK1. Consequently, it becomes easy to uniformly form the organic layer 32 on each sub pixel 3.

Moreover, the plurality of columns of upper step parts BK1b2 is provided as described above, and accordingly it is possible to increase irregularities of the bank BK1. As a result, it is possible to increase irregularities of the first inorganic layer 31. Consequently, it is possible to further improve adhesion between the first inorganic layer 31 and the organic layer 32.

Note that FIG. 16 illustrates the example in which the upper step part BK1b2 of bank BK1 is provided with slits S. When the upper step part BK1b2 of the bank BK1 is provided with slits S, it becomes easy to uniformly form the organic layer 32 on each sub pixel 3, as described in the third modification. However, slits S are not necessarily required in the present modification. Even when the upper step part BK1b2 is provided with no slit S, the above effect can be obtained.

Note that in the present modification, the upper step part BK1b2 may be provided with slits S between the sub pixels 3 adjacent to each other in an oblique direction intersecting each of a row direction and a column direction in a plan view.

Fourth Embodiment

Yet another embodiment of the disclosure will be described mainly with reference to FIG. 17. Note that differences from the first to third embodiments will be described in the present embodiment, and components having the same functions as the components in the first to third embodiments are given the same reference signs and description of these components will be omitted.

Schematic Configuration of Organic EL Display Device

Figure 17:
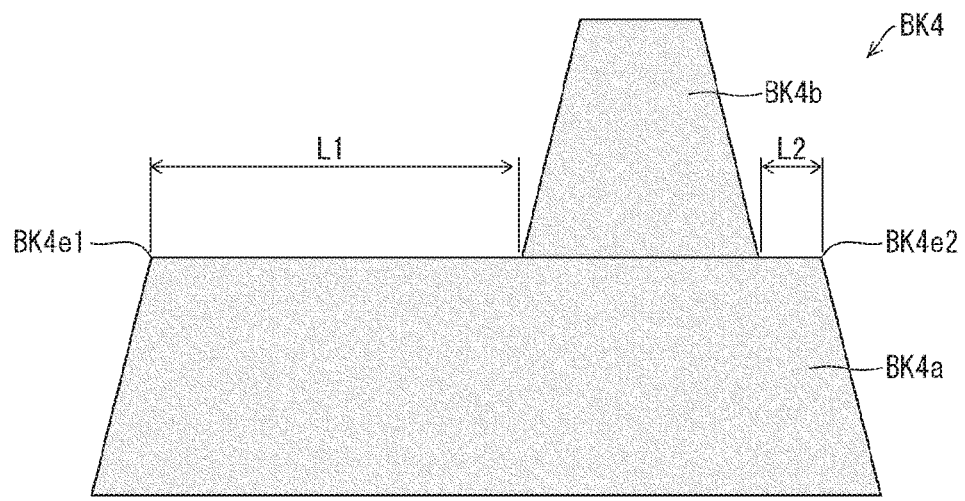
FIG. 17 is a cross-sectional view illustrating an example of a shape of a bank used as an organic film stopper in an organic EL display device according to a fourth embodiment of the disclosure.

FIG. 17 is a cross-sectional view illustrating an example of a shape of a bank used as an organic film stopper in the organic EL display device 1 according to the present embodiment.

Note that as illustrated in FIG. 4, the bank BK4 will be described below as an example of the organic film stopper.

The organic EL display device 1 according to the present embodiment is the same as the organic EL display device 1 according to the first to third embodiments except the following.

As illustrated in FIG. 17, in the organic EL display device 1 according to the present embodiment, the upper step part BK4b is formed on the lower step part BK4a to satisfy L1>L2, where L1 represents the shortest distance from edge BK4e1 of an upper face on the display region 5 side (in other words, the pixel 4 side) of the lower step part BK4a to the upper step part BK4b in the bank BK4, and L2 represents the shortest distance from the edge BK4e2 of an upper face on the side opposite the display region 5 of the lower step part BK4a to the upper step part BK4b in the bank BK4.

Thus, according to the present embodiment, the upper step part BK4b (upper step bank) of the bank BK4 serving as an organic film stopper is disposed close to the side opposite the display region 5 of the lower step part BK4a (lower step bank), and accordingly a liquid organic insulating material (for example, ink) serving as a material of the organic layer 32 accumulates in a portion having the width of L1 from the edge BK4e1 of the upper face on the display region 5 side of the lower step part BK4a to the upper step part BK4b in the bank BK4. Consequently, according to the present embodiment, the material of the organic layer 32 becomes easy to stop on the bank BK4.

Note that the example in which the bank BK4 serves as the organic film stopper is described above; however, the present embodiment is not limited to this example. In the example described above, the bank BK4, the lower step part BK4*a*, the upper step part BK4*b*, the edge BK4*e*1 and the edge BK4*e*2 can be read as the bank BK5, the lower step part BK5*a*, the upper step part BK5*b*, the edge BK5*e*1 and the edge BK5*e*2 in this order.

Supplement

A display device (organic EL display device 1) according to aspect 1 of the disclosure is a display device including a display region 5 provided with a plurality of pixels 4 including a plurality of sub pixels 3, the display device including a plurality of light emitting elements (organic EL elements 24) each including a first electrode 21, a functional layer (organic EL layer 22) including a light emitting layer and a second electrode 23 layered one on another in this order, with at least the first electrode 21 being provided for each sub pixel 3; a first bank (bank BK1) configured to cover a peripheral portion of the first electrode 21; and a sealing film 30 including a first inorganic layer 31, an organic layer 32 and a second inorganic layer 33 layered one on another in this order from the second electrode 23 side, and being configured to seal the plurality of light emitting elements; wherein the first bank is intermittently provided with a first high bank part (bank BK1*b*) and a first low bank part (bank BK1*a*) having a height less than a height of the first high bank part.

According to aspect 2 of the disclosure, in the display device (organic EL display device 1) according to aspect 1, the first inorganic layer 31 may be provided with irregularities derived from the first high bank part and the first low bank part.

According to aspect 3 of the disclosure, in the display device (organic EL display device 1) according to aspect 1 or 2, the high bank part may include a step shaped bank part including a plurality of steps.

According to aspect 4 of the disclosure, in the display device (organic EL display device 1) according to aspect 3, the step shaped bank part may include a layered structure including a plurality of resin layers (first resin layer E1, second resin layer E2) differing in a development speed and layered one on another.

According to aspect 5 of the disclosure, a display device (organic EL display device 1) of the disclosure is a display device including a display region 5 provided with a plurality of pixels 4 including a plurality of sub pixels 3, the display device including a plurality of light emitting elements (organic EL elements 24) each including a first electrode 21, a functional layer (organic EL layer 22) including a light emitting layer and a second electrode 23 layered one on another in this order, with at least the first electrode 21 being provided for each sub pixel 3; a first bank (bank BK1) configured to cover a peripheral portion of the first electrode 21; and a sealing film 30 including a first inorganic layer 31, an organic layer 32 and a second inorganic layer 33 layered one on another in this order from the second electrode 23 side, and being configured to seal the plurality of light emitting elements; wherein the first bank includes a first step shaped bank part (bank BK1*b*) including a plurality of steps, the functional layer and the second electrode 23 are located below a lower step (lower step part BK1*b*1) of the first step shaped bank part between the first step shaped bank part and a bank part adjacent to the first step shaped bank part in the first bank, and the first inorganic layer 31 is provided with irregularities derived from the plurality of steps of the first step shaped bank part.

According to aspect 6 of the disclosure, in the display device (organic EL display device 1) according to aspect 5, the first step shaped bank part may include a layered structure including a plurality of resin layers (first resin layer E1, second resin layer E2) differing in a development speed and layered one on another.

According to aspect 7 of the disclosure, in the display device (organic EL display device 1) according to aspect 5 or 6, the first bank may include a first low bank part (bank BK1*a*) including a single-step bank part having no step shape and having a height less than a height of the first step shaped bank part, and the first bank may intermittently be provided with a first high bank part including the first step shaped bank part, and the first low bank part.

According to the eighth aspect of the disclosure, in the display device (organic EL display device 1) according to aspect 5 or 6, the first bank may entirely include the first step shaped bank part.

According to aspect 9 of the disclosure, in the display device (organic EL display device 1) according to any of aspects 5 to 8, the first step shaped bank may include a lower step bank (bank BK1*b*1) and an upper step bank (bank BK1*b*2) layered on the lower step bank, and the upper step bank may be provided with a slit S configured for partition of the upper step bank in a direction orthogonal to the upper step bank, between sub pixels 3 adjacent to each other.

According to aspect 10 of the disclosure, in the display device (organic EL display device 1) according to any of aspects 5 to 8, the first step shaped bank may include a lower step bank (bank BK1*b*1) and an upper step bank (bank BK1*b*2) layered on the lower step bank, and a plurality of lines of the upper step banks is provided on the lower step bank.

According to aspect 11 of the disclosure, in the display device (organic EL display device 1) according to aspect 10, the upper step bank may be provided with a slit S configured for partition of the upper step bank in a direction orthogonal to the upper step bank, between sub pixels 3 adjacent to each other.

According to aspect 12 of the disclosure, in the display device (organic EL display device 1) according to any of aspects 1 to 4 and 7, the display device may include, outside of the display region 5, a second bank (bank BK2) covered with a sealing film 30 and surrounding the display region 5, the second bank may include a second high bank part having a height (h2) greater than a height (h1*a*) of the first low bank part, and density of the second high bank part per area corresponding to one pixel in a mounting region of the second bank may be higher than density of the first high bank part per pixel in the display region 5 serving as a mounting region of the first bank.

According to aspect 13 of the disclosure, in the display device (organic EL display device 1) according to aspect 12, density of the second bank per area corresponding to one pixel in a mounting region of the second bank may be higher than density of the first bank per pixel in the display region 5 serving as a mounting region of the first bank.

According to aspect 14 of the disclosure, in the display device (organic EL display device 1) according to aspect 12 or 13, the second bank may entirely include the second high bank part.

According to aspect 15 of the disclosure, in the display device (organic EL display device 1) according to any of aspects 1 to 4 and 7, the display device may include, outside of the display region 5, a second bank (bank BK2) covered with a sealing film 30 and surrounding the display region 5, the second bank may include a second high bank part having a height (h2) greater than a height (h1*a*) of the first low bank part, and a pitch between the second high bank parts adjacent to each other may be less than a pitch between the first high bank parts adjacent to each other.

According to aspect 16 of the disclosure, in the display device (organic EL display device 1) according to any of aspects 12 to 15, the second high bank part may include a second step shaped bank part including a plurality of steps.

According to aspect 17 of the disclosure, in the display device (organic EL display device 1) according to aspect 16, the second step shaped bank part may include a layered structure including a plurality of resin layers (first resin layer E1, second resin layer E2) differing in a development speed and layered one on another.

According to aspect 18 of the disclosure, in the display device (organic EL display device 1) according to any of aspects 12 to 17, the second bank may include a plurality of columns of a plurality of dot shaped banks BK2a disposed in a multiple-frame shape, and dot shaped banks BK2a in columns adjacent to each other may be alternately disposed.

According to aspect 19 of the disclosure, in the display device (organic EL display device 1) according to any of aspects 12 to 17, the second bank may include a plurality of frame shaped banks formed in continuous line.

According to aspect 20 of the disclosure, in the display device (organic EL display device 1) according to any of aspects 12 to 19, the display device may include, outside of display region 5, a third bank (bank BK3) surrounding the second bank, the third bank may include a third high bank part having a height (h3) greater than the height (h1a) of the first low bank part, and density of the third high bank part per area corresponding to one pixel in a mounting region of the third bank may be higher than density of the first high bank part per pixel in the display region serving as a mounting region of the first bank.

According to aspect 21 of the disclosure, in the display device (organic EL display device 1) according to aspect 20, density of the third bank part per area corresponding to one pixel in a mounting region of the third bank may be higher than density of the first bank part per pixel in the display region serving as a mounting region of the first bank.

According to aspect 22 of the disclosure, in the display device (organic EL display device 1) according to aspect 20 or 21, the third bank may entirely include the third high bank part.

According to aspect 23 of the disclosure, in the display device (organic EL display device 1) according to any of aspects 20 to 22, the third high bank part may include a third step shaped bank part including a plurality of steps.

According to aspect 24 of the disclosure, in the display device (organic EL display device 1) according to any of aspects 12 to 19, the display device may include, outside of the display region, a third bank (bank BK3) surrounding the second bank, the third bank may include a third high bank part having a height (h3) greater than the height (h1a) of the first low bank part, and a pitch between the third high bank parts adjacent to each other may be less than a pitch between the first high bank parts adjacent to each other.

According to aspect 25 of the disclosure, in the display device (organic EL display device 1) according to aspects 20 to 25, the third step shaped bank part may include a layered structure including a plurality of resin layers (first resin layer E1, second resin layer E2) differing in a development speed and layered one on another.

According to aspect 26 of the disclosure, in the display device (organic EL display device 1) according to any of aspects 20 to 25, the third bank may include a plurality of columns of frame shaped banks including a plurality of dot shaped banks BK3a, and dot shaped banks BK3a in columns adjacent to each other may be alternately disposed.

According to aspect 27 of the disclosure, in the display device (organic EL display device 1) according to any of aspects 20 to 25, the third bank may include a plurality of frame shaped banks formed in continuous line.

According to aspect 28 of the disclosure, in the display device (organic EL display device 1) according to any of aspects 20 to 27, the first electrode 21 may be provided on a flattening film including a first organic insulating film pattern (first organic insulating film pattern part 17A), the second bank may be provided on the flattening film, and the third bank may be provided on a second organic insulating film pattern (second organic insulating film pattern part 17B) separated from the flattening film.

According to aspect 29 of the disclosure, in the display device (organic EL display device 1) according to any of aspects 1 to 4, 7 and 12 to 28, the high bank part may be provided in a linear shape along a second direction orthogonal to a first direction (a row direction or a column direction) with at least one pixel being sandwiched in the first direction.

According to aspect 30 of the disclosure, in the display device (organic EL display device 1) according to any of aspects 1 to 4, 7 and 12 to 28, the high bank part may be provided in a linear shape along a second direction orthogonal to a first direction (a row direction or a column direction) with at least one pixel 4 being sandwiched in the first direction, and may be provided in a linear shape along the first direction with at least one pixel 4 being sandwiched in the second direction, to be formed in a lattice shape surrounding at least one pixel 4.

According to aspect 31 the disclosure, in the display device (organic EL display device 1) according to any of aspects 1 to 30, the display device may include, outside of display region 5, at least one frame shaped bank (bank BK4, bank BK5) serving as an organic layer stopper configured to stop the organic layer 32, and including a portion not covered with the organic layer 32 and surrounding display region 5.

According to aspect 32 of the disclosure, in the display device (organic EL display device 1) according to aspect 31, the bank serving as the organic layer stopper may be formed in a continuous linear shape.

According to aspect 33 of the disclosure, in the display device (organic EL display device 1) according to aspect 31 or 32, the bank serving as the organic layer stopper may include a lower step bank (lower step part BK4a, lower step part BK5a) and an upper step bank (bank BK4b, bank BK5b) layered on the lower step bank, and the upper step bank may be formed on the lower step bank to satisfy L1>L2, where L1 represents the shortest distance from an edge (edge BK4e1, edge BK5e1) of an upper face on the display region 5 side of the lower step bank to the upper step bank (upper step part BK4b, upper step part BK5b), and L2 represents the shortest distance from an edge (edge BK4e2, edge BK5e2) of an upper face on the side opposite display region 5 of the lower step bank to the upper step bank (upper step part BK4b, upper step part BK5b).

According to aspect 34 of the disclosure, in the display device (organic EL display device 1) according to any of aspects 31 to 33, all banks provided outside of the display region 5 (at least one of the bank BK2, bank BK3, bank BK4 and bank BK5) may include high banks each having a height (h4, h5) greater than a height (h1) of the first low bank part.

According to aspect 35 of the disclosure, in the display device (organic EL display device 1) according to aspect 34, all banks provided outside of display region 5 may include step shaped banks including a plurality of steps.

According to aspect 36 of the disclosure, in the display device (organic EL display device 1) according to aspect 35, the step shaped bank may include a layered structure including a plurality of resin layers (first resin layer E1, second resin layer E2) differing in a development speed and layered one on another.

According to aspect 37 of the disclosure, a production method of a display device includes a display region 5 provided with a plurality of pixels 4 including a plurality of sub pixels 3, the display device including a plurality of light emitting elements (organic EL elements 24) each including a first electrode 21, a functional layer (organic EL layer 22) including a light emitting layer and a second electrode 23 layered one on another in this order, with at least the first electrode 21 being provided for each sub pixel 3; a first bank (bank BK1) configured to cover a peripheral portion of the first electrode 21; and a sealing film 30 including a first inorganic layer 31, an organic layer 32 and a second inorganic layer 33 layered one on another in this order from the second electrode 23 side, and being configured to seal the plurality of light emitting elements, the production method including: forming the first bank; forming the functional layer to cover the first electrode 21 including the peripheral portion covered with the first bank; forming the second electrode 23 to cover the functional layer; and the forming sealing film 30 to seal the plurality of light emitting elements, wherein the forming the first bank includes intermittently forming a first high bank part (bank BK1b) and a first low bank part (bank BK1a) having a height less than a height of the first high bank part.

According to aspect 38 of the disclosure, in the production method of a display device (organic EL display device 1) according to aspect 37, the forming the first bank may include forming, as the high bank part, a step shaped bank part including a plurality of steps.

According to aspect 39 of the disclosure, a production method of a display device includes a display region 5 provided with a plurality of pixels 4 including a plurality of sub pixels 3, the display device including a plurality of light emitting elements (organic EL elements 24) each including a first electrode 21, a functional layer (organic EL layer 22) including a light emitting layer and a second electrode 23 layered one on another in this order, with at least the first electrode 21 being provided for each of sub pixels 3; a first bank (bank BK1) configured to cover a peripheral portion of the first electrode 21; and a sealing film 30 including a first inorganic layer 31, an organic layer 32 and a second inorganic layer 33 layered one on another in this order from the second electrode 23 side, and being configured to seal the plurality of light emitting elements, the production method including: forming the first bank; forming the functional layer to cover the first electrode 21 including the peripheral portion covered with the first bank; forming the second electrode 23 to cover the functional layer; and forming the sealing film 30 to seal the plurality of light emitting elements, wherein the forming the first bank includes forming the first bank including a first step shaped bank part including a plurality of steps, the forming the functional layer includes forming the functional layer to be located below a lower step of the first step shaped bank part between the first step shaped bank part and a bank part adjacent to the first step shaped bank part in the first bank, and the forming the second electrode includes forming the second electrode 23 to be located below the lower step of the first step shaped bank part between the first step shaped bank part and the bank part adjacent to the first step shaped bank part in the first bank.

The disclosure is not limited to each of the embodiments described above, and various modifications may be implemented within the scope of the claims. Embodiments obtained by appropriately combining the technical approaches disclosed in each of the different embodiments also fall within the technical scope of the disclosure. Further, novel technical features can be formed by combining the technical approaches disclosed in each of the embodiments.

REFERENCE SIGNS LIST

1 Organic EL display device (display device)
2 Organic EL substrate
3 Sub pixel
4 Pixel
5 Display region
6 Frame region
10 TFT substrate
12 TFT layer
11 Support body
12T Terminal part
13 Semiconductor layer
14 Gate insulating film
15, 16 Inorganic insulating film
17 Organic insulating film
17A First organic insulating film pattern part (first organic insulating film pattern, flattening film)
17B Second organic insulating film pattern part (second organic insulating film pattern)
17C Third organic insulating film pattern part
17D Fourth organic insulating film pattern part
18 TFT
20 OLED layer
21 First electrode
22 Organic EL layer (functional layer)
23 Second electrode
24 Organic EL element (light emitting element)
25 Organic film
30 Sealing film
31 First inorganic layer
32 Organic layer
33 Second inorganic layer
BK, BK1, BK2, BK3, BK4, BK5, BK1a, BK1b Bank BK1A Opening
BK1b1, BK2a1, BK3a1, BK4a, BK5a Lower step part
BK1b2, BK2a2, BK3a2, BK4b, BK5b Upper step part
BK2a, BK3a Dot shaped bank
BK2a', BK3a' Linear shaped bank
BK4e1, BK4e2 Edge
E1 First resin layer
E2 Second resin layer
M Mask
M1a, M1b, M2, M3, M4, M5, Ma Opening
S Slit

The invention claimed is:

1. A display device including a display region provided with a plurality of pixels including a plurality of sub pixels, the display device comprising:
a plurality of light emitting elements each including a first electrode, a functional layer including a light emitting layer and a second electrode layered one on another in this order, with at least the first electrode being provided for each of the sub pixels;

a first bank configured to cover a peripheral portion of the first electrode; and a sealing film including a first inorganic layer, an organic layer and a second inorganic layer layered one on another in this order from the second electrode side, and being configured to seal the plurality of light emitting elements, wherein the first bank is intermittently provided with a first high bank part and a first low bank part having a height less than a height of the first high bank part, a second bank covered with the sealing film and surrounding the display region is provided outside of the display region, and the second bank includes a second high bank part having a height greater than the height of the first low bank part, and density of the second high bank part per area corresponding to one pixel in a mounting region of the second bank is higher than density of the first high bank part per pixel in the display region serving as a mounting region of the first bank.

2. The display device according to claim 1,
wherein the first inorganic layer is provided with irregularities derived from the first high bank part and the first low bank part.

3. The display device according to claim 1,
wherein the high bank part includes a step shaped bank part including a plurality of steps.

4. The display device according to claim 1,
wherein density of the second bank per area corresponding to one pixel in a mounting region of the second bank is higher than density of the first bank per pixel in the display region serving as a mounting region of the first bank.

5. The display device according to claim 1,
wherein the second bank entirely includes the second high bank part.

6. The display device according to claim 1,
wherein the second high bank part includes a second step shaped bank part including a plurality of steps.

7. The display device according to claim 1,
wherein the second bank includes a plurality of columns of a plurality of dot shaped banks disposed in a multiple-frame shape, and dot shaped banks in columns adjacent to each other are alternately disposed.

8. The display device according to claim 1,
wherein the second bank includes a plurality of frame shaped banks formed in continuous line.

9. The display device according to claim 1,
wherein a third bank surrounding the second bank is provided outside of the display region,
the third bank includes a third high bank part having a height greater than the height of the first low bank part, and
density of the third high bank part per area corresponding to one pixel in a mounting region of the third bank is higher than density of the first high bank part per pixel in the display region serving as a mounting region of the first bank.

10. The display device according to claim 9,
wherein density of the third bank part per area corresponding to one pixel in a mounting region of the third bank is higher than density of the first bank part per pixel in the display region serving as a mounting region of the first bank.

11. The display device according to claim 1,
wherein a third bank surrounding the second bank is provided outside of the display region,
the third bank includes a third high bank part having a height greater than the height of the first low bank part, and
a pitch between the third high bank parts adjacent to each other is less than a pitch between the first high bank parts adjacent to each other.

12. The display device according to claim 9,
wherein the third bank includes a plurality of columns of frame shaped banks including a plurality of dot shaped banks, and dot shaped banks in columns adjacent to each other are alternately disposed.

13. A display device including a display region provided with a plurality of pixels including a plurality of sub pixels, the display device comprising:
a plurality of light emitting elements each including a first electrode, a functional layer including a light emitting layer and a second electrode layered one on another in this order, with at least the first electrode being provided for each of the sub pixels;
a first bank configured to cover a peripheral portion of the first electrode; and
a sealing film including a first inorganic layer, an organic layer and a second inorganic layer layered one on another in this order from the second electrode side, and being configured to seal the plurality of light emitting elements,
wherein the first bank includes a first step shaped bank part including a plurality of steps,
the functional layer and the second electrode are located below a lower step of the first step shaped bank part between the first step shaped bank part and a bank part adjacent to the first step shaped bank part in the first bank,
the first inorganic layer is provided with irregularities derived from the plurality of steps of the first step shaped bank part,
the first step shaped bank includes a lower step bank and an upper step bank layered on the lower step bank, and
a plurality of columns of the upper step banks is provided on the lower step bank.

14. The display device according to claim 13,
wherein the first step shaped bank part includes a layered structure including a plurality of resin layers differing in a development speed and layered one on another.

15. The display device according to claim 13,
wherein the first bank includes a first low bank part including a single-step bank part having no step shape and having a height less than a height of the first step shaped bank part, and
the first bank is intermittently provided with a first high bank part including the first step shaped bank part, and the first low bank part.

16. The display device according to claim 13,
wherein the first bank entirely includes the first step shaped bank part.

17. The display device according to claim 13,
wherein the upper step bank is provided with a slit configured for partition of the upper step bank in a direction orthogonal to the upper step bank, between sub pixels adjacent to each other.

18. A display device including a display region provided with a plurality of pixels including a plurality of sub pixels, the display device comprising:
a plurality of light emitting elements each including a first electrode, a functional layer including a light emitting layer and a second electrode layered one on another in this order, with at least the first electrode being provided for each of the sub pixels;

a first bank configured to cover a peripheral portion of the first electrode; and a sealing film including a first inorganic layer, an organic layer and a second inorganic layer layered one on another in this order from the second electrode side, and being configured to seal the plurality of light emitting elements, wherein the first bank is intermittently provided with a first high bank part and a first low bank part having a height less than a height of the first high bank part a second bank covered with the sealing film and surrounding the display region is provided outside of the display region, and the second bank includes a second high bank part having a height greater than the height of the first low bank part, and a pitch between the second high bank parts adjacent to each other is less than a pitch between the first high bank parts adjacent to each other.

19. The display device according to claim 18, wherein the second bank includes a plurality of columns of a plurality of dot shaped banks disposed in a multiple-frame shape, and dot shaped banks in columns adjacent to each other are alternately disposed.

20. The display device according to claim 18, wherein the second bank includes a plurality of frame shaped banks formed in continuous line.

* * * * *